United States Patent
Saito et al.

(10) Patent No.: US 12,241,915 B2
(45) Date of Patent: Mar. 4, 2025

(54) ELECTRIC CURRENT SENSOR

(71) Applicant: TOKIN CORPORATION, Shiroishi (JP)

(72) Inventors: Gota Saito, Sendai (JP); Masuto Saito, Sendai (JP); Tetsuya Yoshinari, Sendai (JP); Noritaka Niiyama, Sendai (JP)

(73) Assignee: TOKIN CORPORATION, Miyagi (JP)

( * ) Notice: Subject to any disclaimer, the term of this patent is extended or adjusted under 35 U.S.C. 154(b) by 18 days.

(21) Appl. No.: 18/032,376

(22) PCT Filed: Oct. 25, 2021

(86) PCT No.: PCT/JP2021/039298
§ 371 (c)(1),
(2) Date: Apr. 18, 2023

(87) PCT Pub. No.: WO2022/092027
PCT Pub. Date: May 5, 2022

(65) Prior Publication Data
US 2023/0384351 A1   Nov. 30, 2023

(30) Foreign Application Priority Data
Oct. 26, 2020   (JP) .................. 2020-178746

(51) Int. Cl.
*G01R 15/18*   (2006.01)
*H01F 38/30*   (2006.01)

(52) U.S. Cl.
CPC ........... *G01R 15/183* (2013.01); *H01F 38/30* (2013.01)

(58) Field of Classification Search
CPC ....... G01R 15/183; H01F 38/30; H01F 27/02; H01F 27/366; H01F 2038/305
(Continued)

(56) References Cited

U.S. PATENT DOCUMENTS

| 2013/0154629 A1 | 6/2013 | Gudel et al. |
| 2014/0132249 A1* | 5/2014 | Loglisci .................. H01F 27/29 324/144 |

(Continued)

FOREIGN PATENT DOCUMENTS

| CN | 106373714 A | 2/2017 |
| CN | 109285658 A | 1/2019 |

(Continued)

OTHER PUBLICATIONS

International Search Report (ISR) (and an English language translation thereof) dated Dec. 28, 2021, issued in International Application No. PCT/JP2021/039298.

(Continued)

*Primary Examiner* — Giovanni Astacio-Oquendo
(74) *Attorney, Agent, or Firm* — Holtz, Holtz & Volek PC

(57) ABSTRACT

An electric current sensor includes an upper shield case, a lower shield case, a press-fit member and an inner member. The upper shield case has at least an upper surface and an upper outer peripheral portion. The upper outer peripheral portion extends downward in an up-down direction from an outer edge of the upper surface. The lower shield case has at least a lower surface and a lower outer peripheral portion. The lower outer peripheral portion extends upward in the up-down direction from an outer edge of the lower surface. The upper shield case and the lower shield case form an accommodating portion. The press-fit member has a main portion. The main portion pushes both of the upper outer peripheral portion and the lower outer peripheral portion outward in a horizontal plane perpendicular to the up-down direction to integrally fix the upper and lower shield cases to each other.

10 Claims, 21 Drawing Sheets

(58) Field of Classification Search
USPC .................................... 324/126, 127, 76.11
See application file for complete search history.

(56) References Cited

U.S. PATENT DOCUMENTS

2018/0366265 A1* 12/2018 Jang .................. H01F 27/25
2021/0265110 A1*  8/2021 Luo .................. G01R 15/186

FOREIGN PATENT DOCUMENTS

| JP | S5638429 U   | 4/1981  |
|----|--------------|---------|
| JP | H07230915 A  | 8/1995  |
| JP | 2003017347 A | 1/2003  |
| JP | 2013140089 A | 7/2013  |
| JP | 2013223339 A | 10/2013 |
| JP | 2015099902 A | 5/2015  |
| JP | 2015194508 A | 11/2015 |
| JP | 2016125839 A | 7/2016  |

OTHER PUBLICATIONS

Japanese Office Action (and an English language translation thereof) dated Jan. 11, 2022, issued in counterpart Japanese Application No. 2022-510134.
Written Opinion dated Dec. 28, 2021, issued in International Application No. PCT/JP2021/039298.
Extended European Search Report (EESR) dated Sep. 20, 2024, issued in counterpart European Application No. 21886145.8.

* cited by examiner

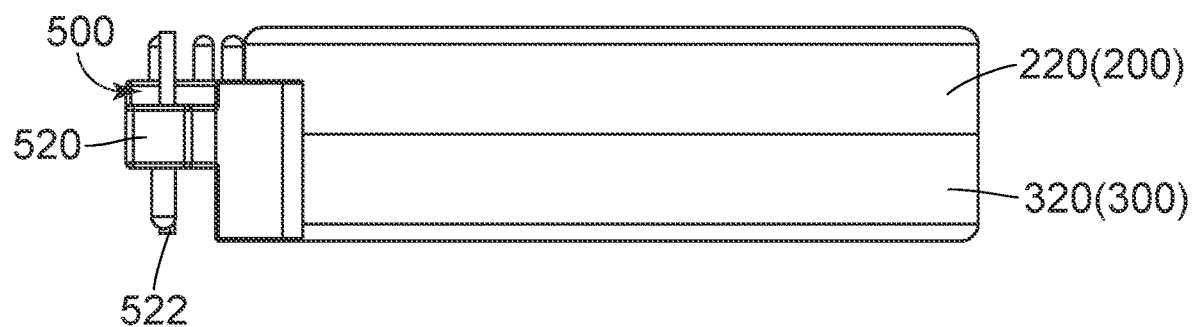
FIG. 16
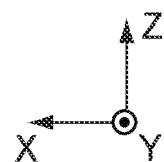

ELECTRIC CURRENT SENSOR

TECHNICAL FIELD

This invention relates to an electric current sensor comprising a coil and an electromagnetic core.

BACKGROUND ART

Patent Document 1 discloses an electric current sensor of this type. As shown in FIGS. 34 and 35, the electric current sensor 900 of Patent Document 1 comprises a circuit board 910, a core portion 920 and a hall element 930. The circuit board 910 has an annular portion 912 and a protruding portion 914. The core portion 920 has a toroidal core 922, a coil (not shown) and an insulative tape 926. The coil is wound around the toroidal core 922. The insulative tape 926 of the core portion 920 is wound around the annular portion 912 of the circuit board 910, and thereby the core portion 920 and the circuit board 910 are integrally fixed to each other.

Since the core portion 920 and the circuit board 910 are integrally fixed to each other, the electric current sensor 900 of Patent Document 1 does not require potting with urethane resin or the like.

PRIOR ART DOCUMENTS

Patent Document(s)

Patent Document 1: JP A 2003-017347

SUMMARY OF INVENTION

Technical Problem

It is an object of the present invention to provide an electric current sensor having a structure which is dissimilar to that of the electric current sensor 900 of Patent Document 1 and which requires no potting.

Solution to Problem

An aspect of the present invention provides an electric current sensor comprising an upper shield case, a lower shield case, a press-fit member and an inner member. The upper shield case has at least an upper surface and an upper outer peripheral portion. The upper surface has an opening at its inside. The upper outer peripheral portion extends downward in an up-down direction from an outer edge of the upper surface. The lower shield case has at least a lower surface and a lower outer peripheral portion. The lower surface has an opening at its inside. The lower outer peripheral portion extends upward in the up-down direction from an outer edge of the lower surface. At least one of the upper shield case and the lower shield case has an inner peripheral portion which extends along the up-down direction from the opening of the at least one of the upper shield case and the lower shield case. The upper shield case and the lower shield case form an accommodating portion. The press-fit member has a main portion. The main portion pushes both of the upper outer peripheral portion and the lower outer peripheral portion outward in a horizontal plane perpendicular to the up-down direction to integrally fix the upper shield case and the lower shield case to each other. The inner member comprises a coil and an electromagnetic core. The inner member is arranged between the main portion and the inner peripheral portion in the accommodating portion.

Advantageous Effects of Invention

In the electric current sensor of the present invention, the main portion of the press-fit member pushes both of the upper outer peripheral portion and the lower outer peripheral portion outward in the horizontal plane perpendicular to the up-down direction to integrally fix the upper shield case and the lower shield case to each other. Thus, the electric current sensor of the present invention does not require potting with urethane resin or the like.

An appreciation of the objectives of the present invention and a more complete understanding of its structure may be had by studying the following description of the preferred embodiment and by referring to the accompanying drawings.

BRIEF DESCRIPTION OF DRAWINGS

FIG. 16 is a side view showing the core component of FIG. 8.

DESCRIPTION OF EMBODIMENTS

Figure 1:
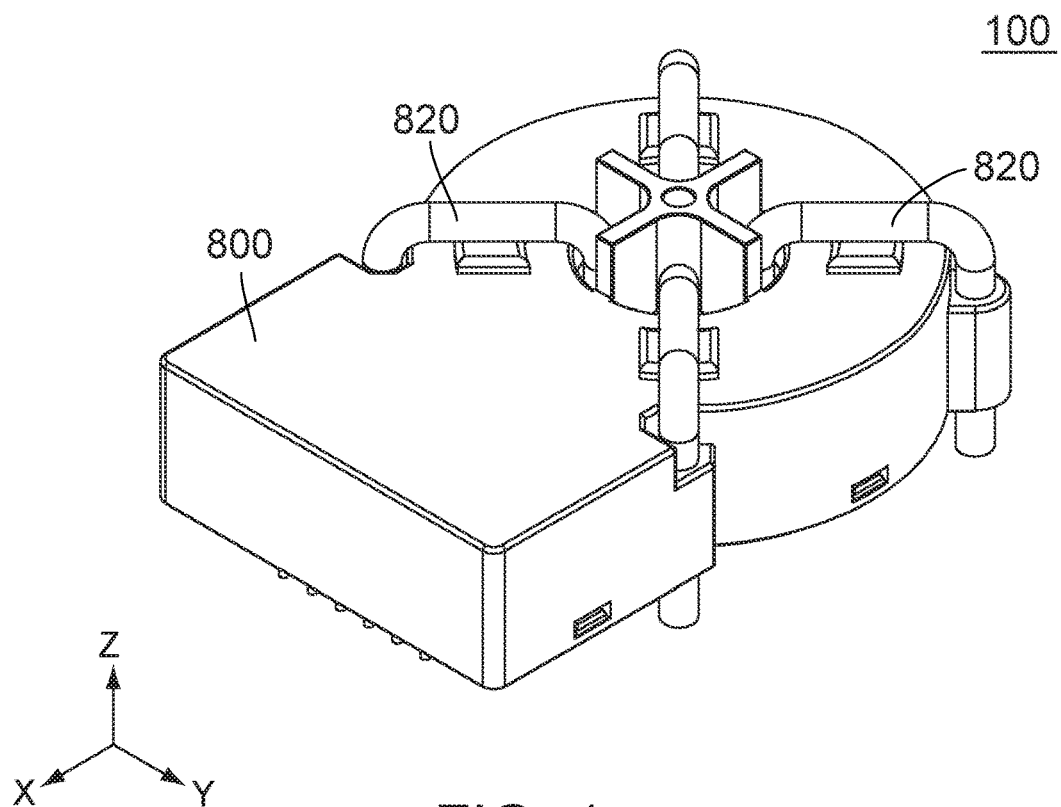
FIG. 1 is a perspective view showing a electric current sensor according to a first embodiment of the present invention.
Figure 2:
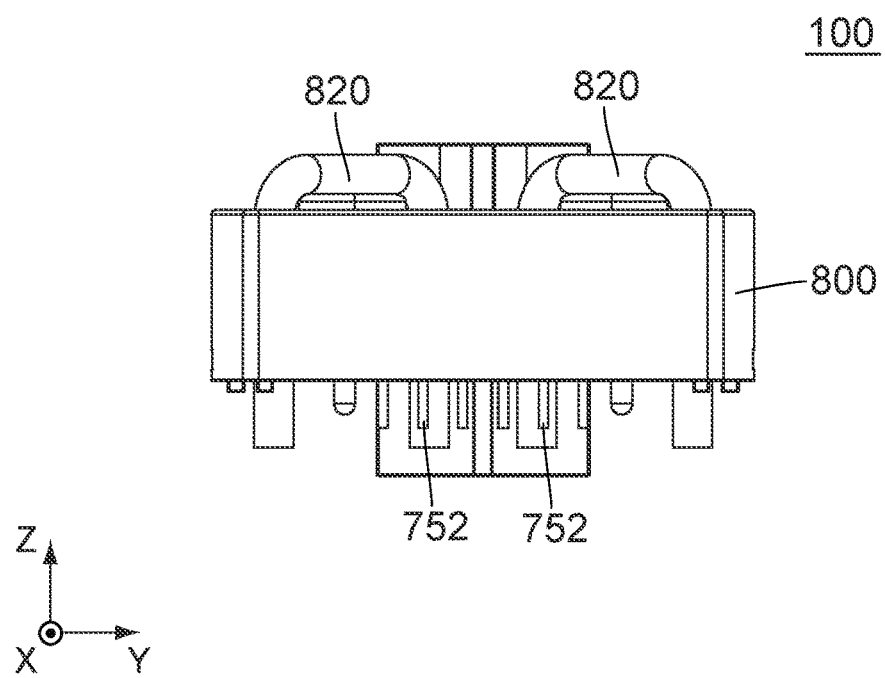
FIG. 2 is a front view showing the electric current sensor of FIG. 1.
Figure 3:
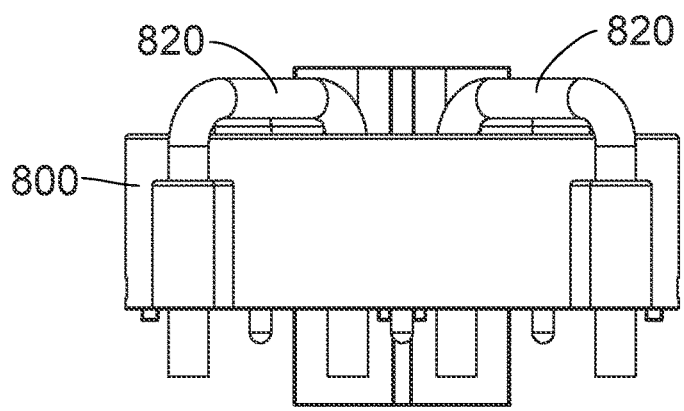
FIG. 3 is a rear view showing the electric current sensor of FIG. 1.
Figure 3:
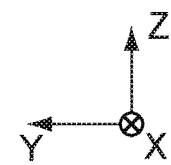
Figure 4:
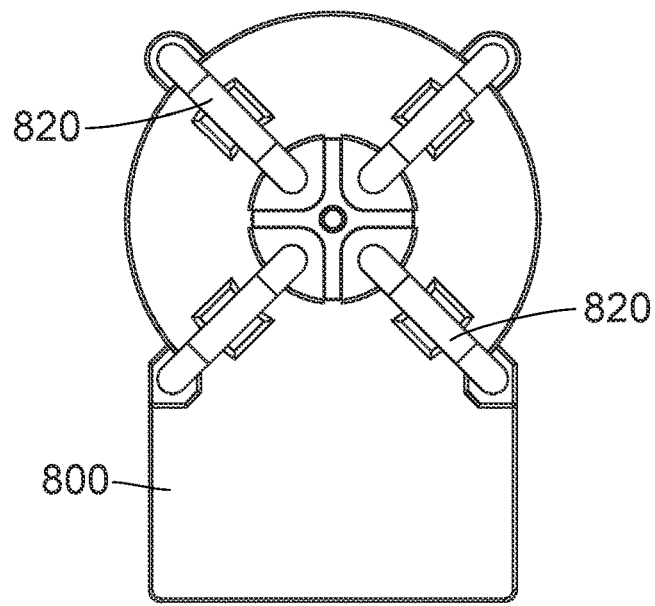
FIG. 4 is a top view showing the electric current sensor of FIG. 1.
Figure 4:
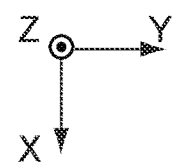

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

First Embodiment

Figure 7:
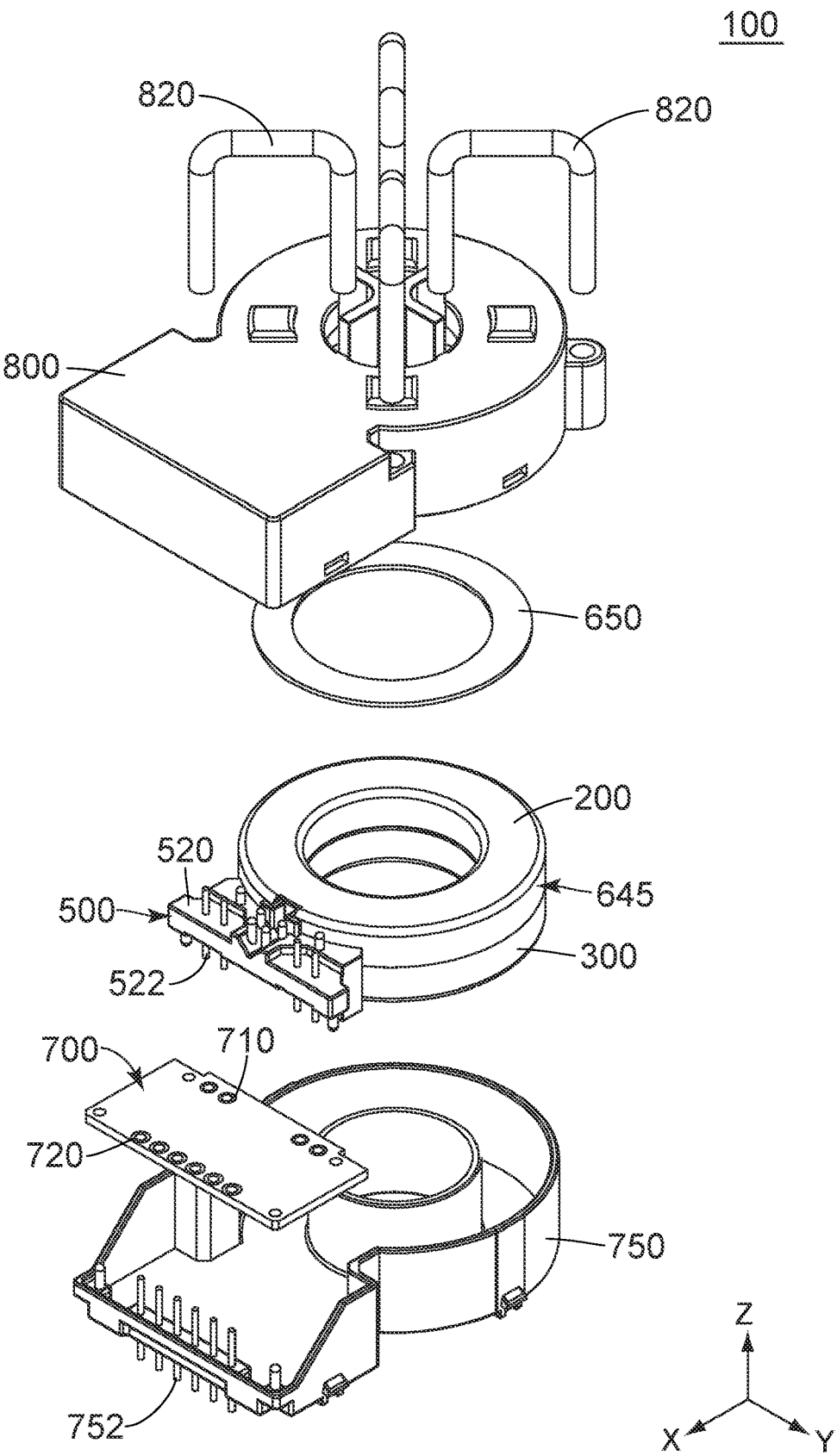
FIG. 7 is an exploded, perspective view showing the electric current sensor of FIG. 1. In the figure, an end portion of a coil is omitted.
Figure 8:
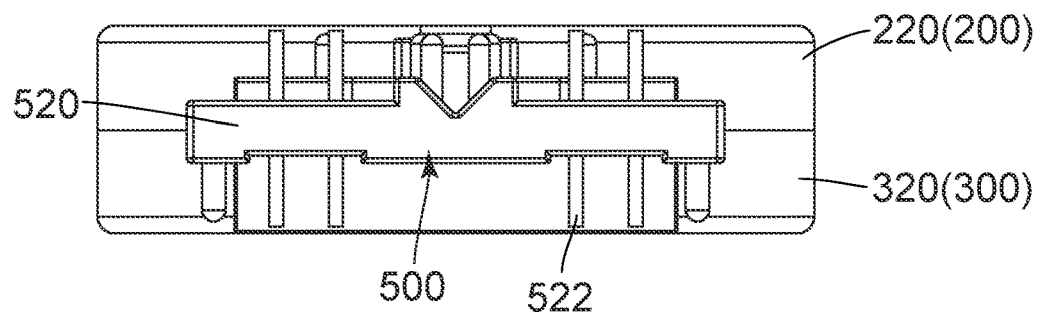
FIG. 8 is a front view showing a core component which is included in the electric current sensor of FIG. 7. In the figure, the end portion of the coil is omitted.
Figure 8:
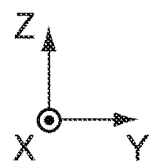
Figure 9:
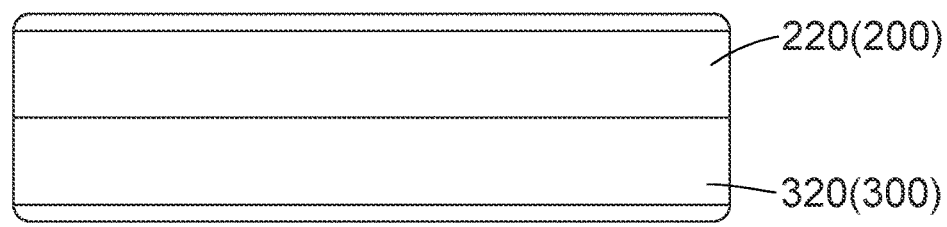
FIG. 9 is a rear view showing the core component of FIG. 8.
Figure 9:
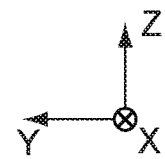
Figure 17:
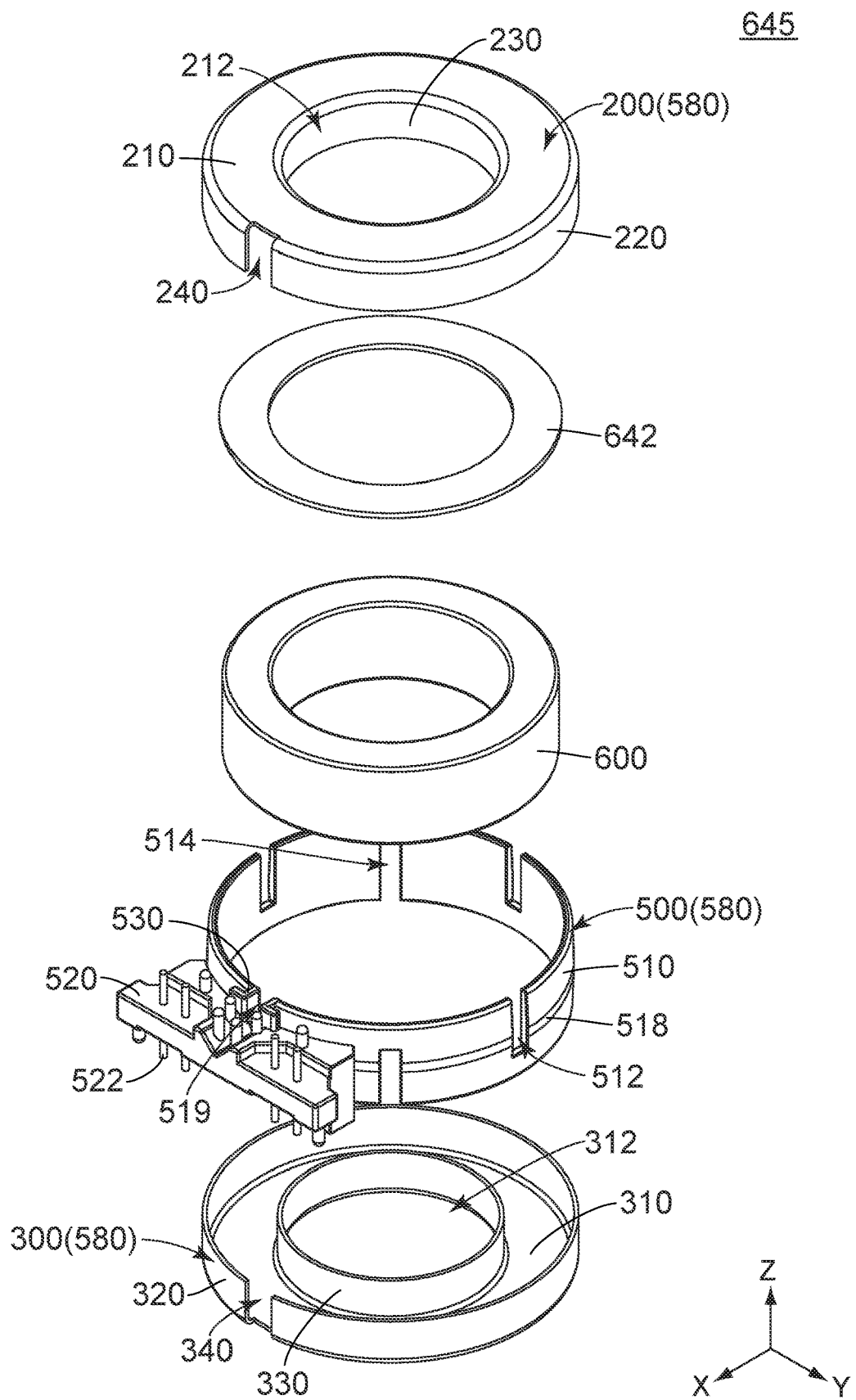
FIG. 17 is an exploded, perspective view showing the core component of FIG. 8.

As understood from FIGS. 7 and 17, an electric current sensor 100 according to a first embodiment of the present invention comprises an upper shield case 200, a lower shield case 300, a press-fit member 500, an inner member 600, a circuit board 700, a housing 750, a case 800 and busbars 820. It is noted that the upper shield case 200, the lower shield case 300 and the press-fit member 500 form a shield case composite 580.

Figure 20:
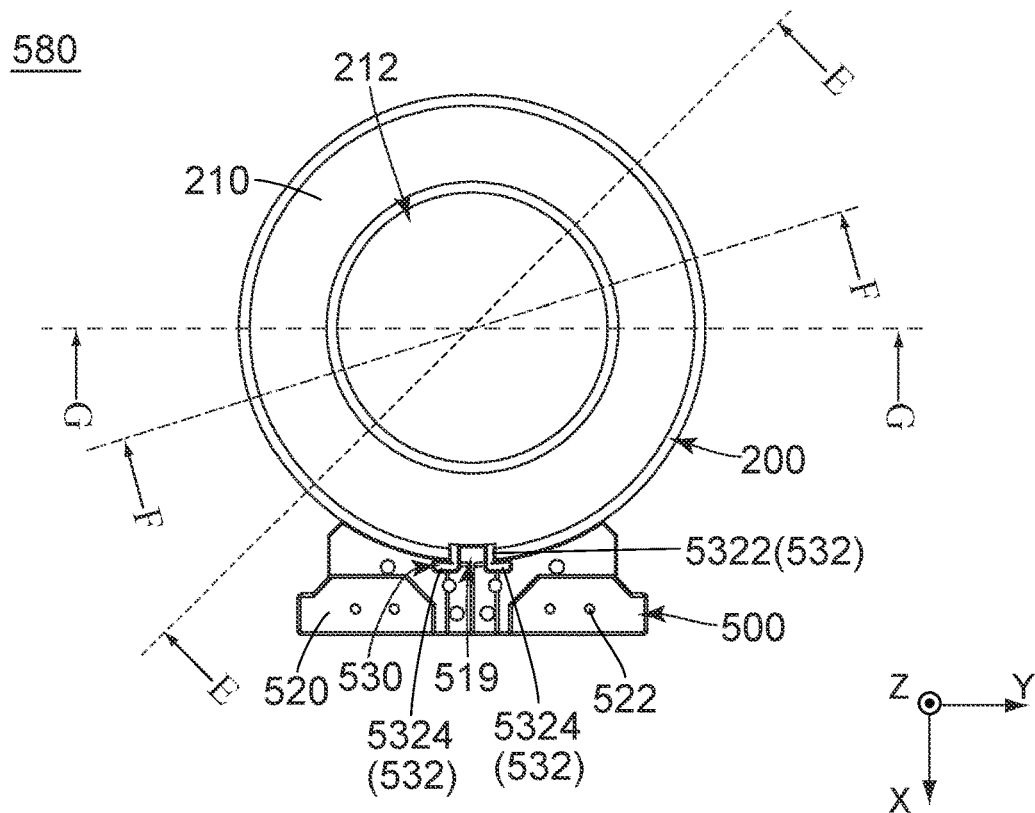
FIG. 20 is a top view showing the shield case composite of FIG. 18.

Referring to FIG. 17, the upper shield case 200 of the present embodiment is made of metal. The upper shield case 200 has an upper surface 210, which has an opening 212 at its inside, an upper outer peripheral portion 220, which extends downward in an up-down direction from an outer edge of the upper surface 210, an upper inner peripheral portion (inner peripheral portion) 230 and an upper communication portion 240. In the present embodiment, the up-down direction is a Z-direction. Specifically, upward is a positive Z-direction while downward is a negative Z-direction. However, the present invention is not limited thereto, but the upper shield case 200 may have no upper inner peripheral portion 230. In other words, the upper shield case 200 should have at least the upper surface 210, which has the opening 212 at its inside, and the upper outer peripheral portion 220 extending downward in the up-down direction from the outer edge of the upper surface 210. As shown in FIG. 20, the upper shield case 200 has an annular ring shape when viewed along the up-down direction. However, the present invention is not limited thereto, but the shape of the upper shield case 200 is not limited to any particular shape. It is noted that the upper shield case 200 can be manufactured from a soft magnetic material such as permalloy, silicon steel, or pure iron.

Referring to FIG. 17, the upper surface 210 of the present embodiment is perpendicular to the up-down direction. The upper surface 210 has an annular ring shape with an axis parallel to the up-down direction. However, the present invention is not limited thereto, but the shape of the upper surface 210 is not limited to any particular shape.

Referring to FIG. 17, the opening 212 of the present embodiment has a circular shape with an axis parallel to the up-down direction. However, the present invention is not limited thereto, but the shape of the opening 212 is not limited to any particular shape. The upper surface 210 and the opening 212 are positioned on the common axis. The opening 212 is positioned inward of the upper surface 210 in a radial direction of the axis of the upper surface 210.

Referring to FIG. 17, the upper outer peripheral portion 220 of the present embodiment extends downward in the up-down direction from the outer edge of the upper surface 210 in the radial direction.

Referring to FIG. 17, the upper inner peripheral portion 230 of the present embodiment extends downward in the up-down direction from an inner edge of the upper surface 210 in the radial direction. The upper inner peripheral portion 230 is positioned outward of the opening 212 in the radial direction. The inner peripheral portion 230 extends along the up-down direction from the opening 212.

Referring to FIG. 17, the upper communication portion 240 of the present embodiment is an aperture which pierces the upper outer peripheral portion 220 in the radial direction perpendicular to the up-down direction. The upper outer peripheral portion 220 is split by the upper communication portion 240 in a circumferential direction of the axis of the upper surface 210. In other words, continuity of the upper outer peripheral portion 220 in the circumferential direction of the upper surface 210 is broken by the upper communication portion 240.

Figure 15:
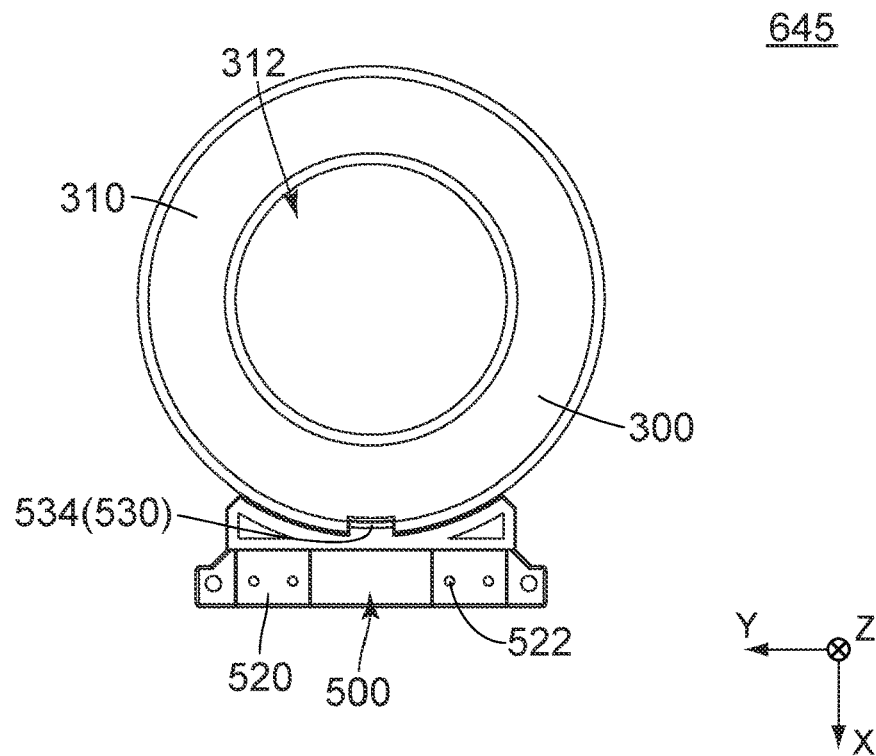
FIG. 15 is a bottom view showing the core component of FIG. 8.

Referring to FIG. 17, the lower shield case 300 of the present embodiment is made of metal. The lower shield case 300 has a lower surface 310, which has an opening 312 at its inside, a lower outer peripheral portion 320, which extends upward in the up-down direction from an outer edge of the lower surface 310, a lower inner peripheral portion (inner peripheral portion) 330 and a lower communication portion 340. However, the present invention is not limited thereto, but the lower shield case 300 may have no lower inner peripheral portion 330. In other words, the lower shield case 300 should have at least the lower surface 310, which has the opening 312 at its inside, and the lower outer peripheral portion 320 extending upward in the up-down direction from the outer edge of the lower surface 310. As shown in FIG. 15, the lower shield case 300 has an annular ring shape when viewed along the up-down direction. However, the present invention is not limited thereto, but the shape of the lower shield case 300 is not limited to any particular shape. It is noted that the lower shield case 300 can be manufactured from a soft magnetic material such as permalloy, silicon steel, or pure iron.

Referring to FIG. 17, the lower surface 310 of the present embodiment is perpendicular to the up-down direction. The lower surface 310 has an annular ring shape with an axis parallel to the up-down direction. However, the present invention is not limited thereto, but the shape of the lower surface 310 is not limited to any particular shape.

Referring to FIG. 17, the opening 312 of the present embodiment has a circular shape with an axis parallel to the up-down direction. However, the present invention is not limited thereto, but the shape of the opening 312 is not limited to any particular shape. The lower surface 310 and the opening 312 are positioned on the common axis. The opening 312 is positioned inward of the lower surface 310 in a radial direction of the axis of the lower surface 310.

Referring to FIG. 17, the lower outer peripheral portion 320 of the present embodiment extends upward in the up-down direction from the outer edge of the lower surface 310 in the radial direction.

Referring to FIG. 17, the lower inner peripheral portion 330 of the present embodiment extends upward in the up-down direction from an inner edge of the lower surface 310 in the radial direction. The lower inner peripheral portion 330 is positioned outward of the opening 312 in the radial direction. The inner peripheral portion 330 extends along the up-down direction from the opening 312.

Referring to FIG. 17, the lower communication portion 340 of the present embodiment is an aperture which pierces the lower outer peripheral portion 320 in the radial direction. The lower outer peripheral portion 320 is split by the lower communication portion 340 in a circumferential direction of the axis of the lower surface 310. In other words, continuity of the lower outer peripheral portion 320 in the circumferential direction of the lower surface 310 is broken by the lower communication portion 340.

Although, as described above, the upper shield case 200 has the inner peripheral portion 230 extending along the up-down direction from the opening 212 while the lower shield case 300 has the inner peripheral portion 330 extending along the up-down direction from the opening 312, the present invention is not limited thereto. Specifically, at least one of the upper shield case 200 and the lower shield case 300 should have the inner peripheral portion 230, 330 which extends along the up-down direction from the opening 212, 312 of the at least one of the upper shield case 200 and the lower shield case 300.

Figure 21:
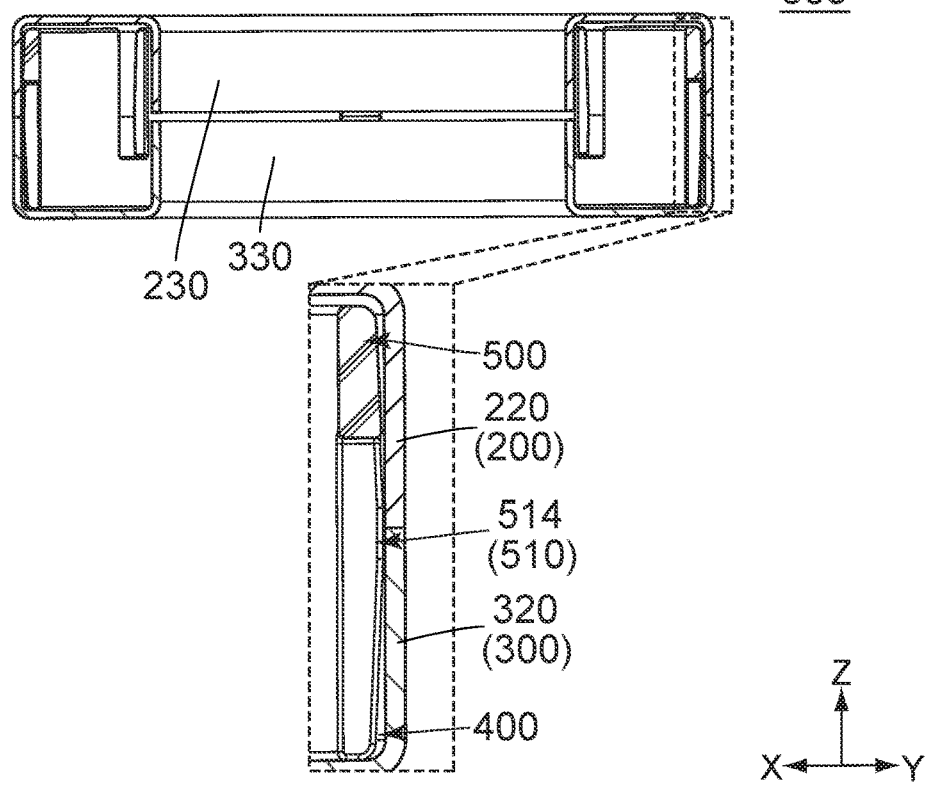
FIG. 21 is a cross-sectional view showing the shield case composite of FIG. 20, taken along line E-E. In the figure, a part of the shield case composite is enlarged and illustrated.

As shown in FIG. 21, the upper shield case 200 and the lower shield case 300 form an accommodating portion 400. The accommodating portion 400 is a ring-shaped space with an axis parallel to the up-down direction.

Figure 22:
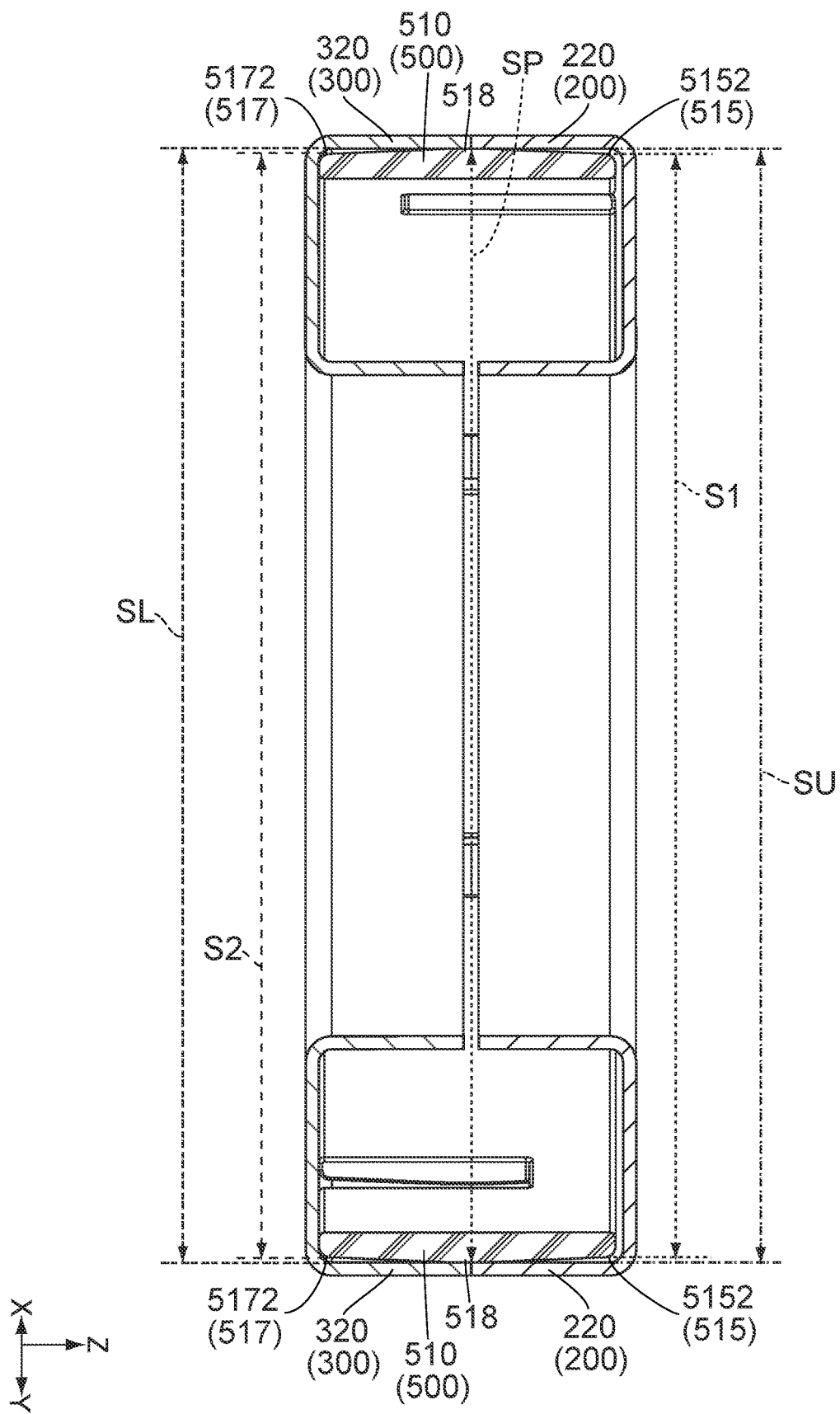
FIG. 22 is a cross-sectional view showing the shield case composite of FIG. 20, taken along line F-F.
Figure 23:
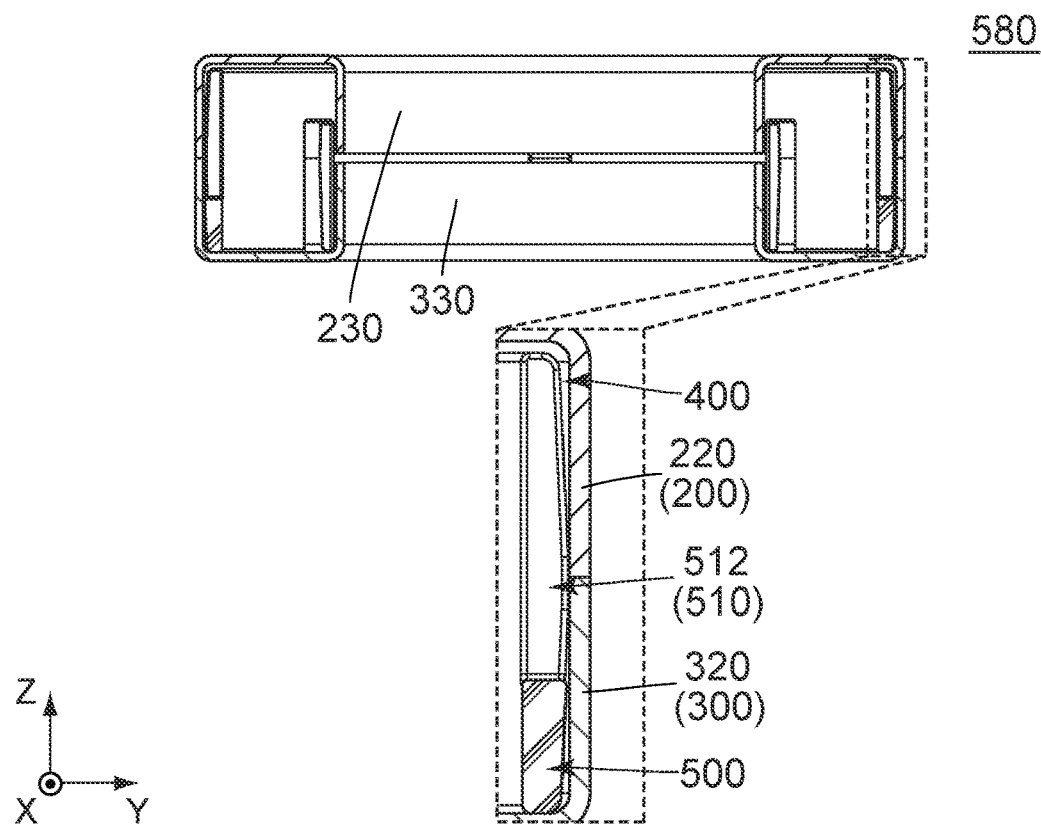
FIG. 23 is a cross-sectional view showing the shield case composite of FIG. 20, taken along line G-G. In the figure, a part of the shield case composite is enlarged and illustrated.
Figure 24:
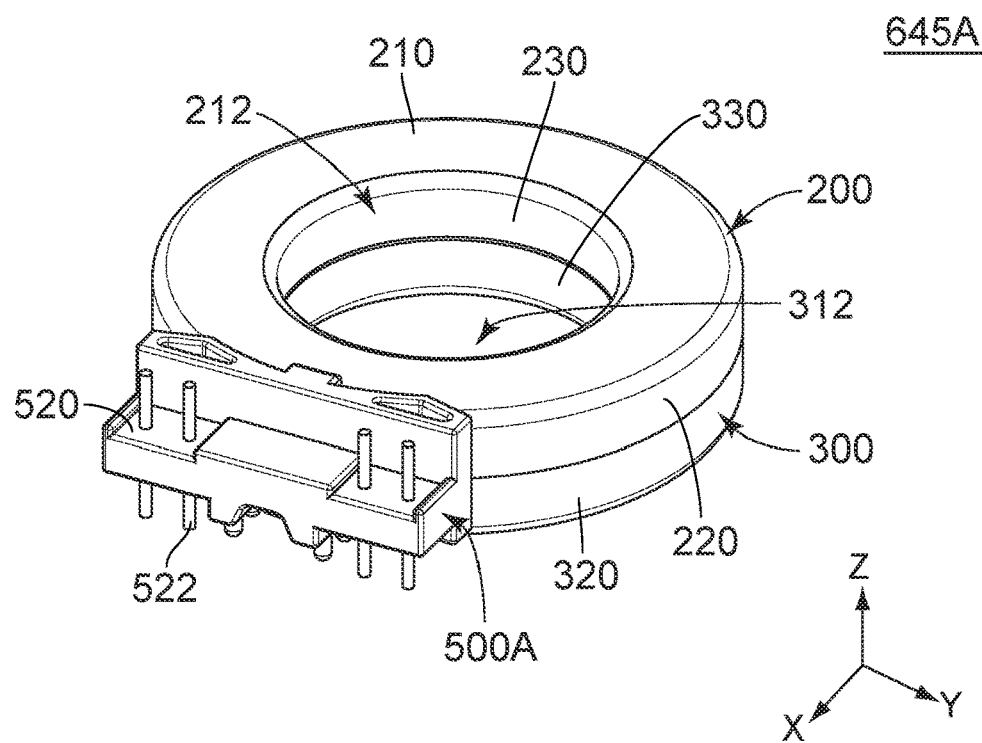
FIG. 24 is a perspective view showing a core component which is included in an electric current sensor according to a second embodiment of the present invention. In the figure, an upper shield case and a lower shield case are press-fit into a press-fit member.

Referring to FIG. 22, the press-fit member 500 of the present embodiment is made of resin. The press-fit member 500 is press-fit into the upper shield case 200. Additionally, the press-fit member 500 is press-fit into the lower shield case 300. The press-fit member 500 has a main portion 510.

Figure 19:
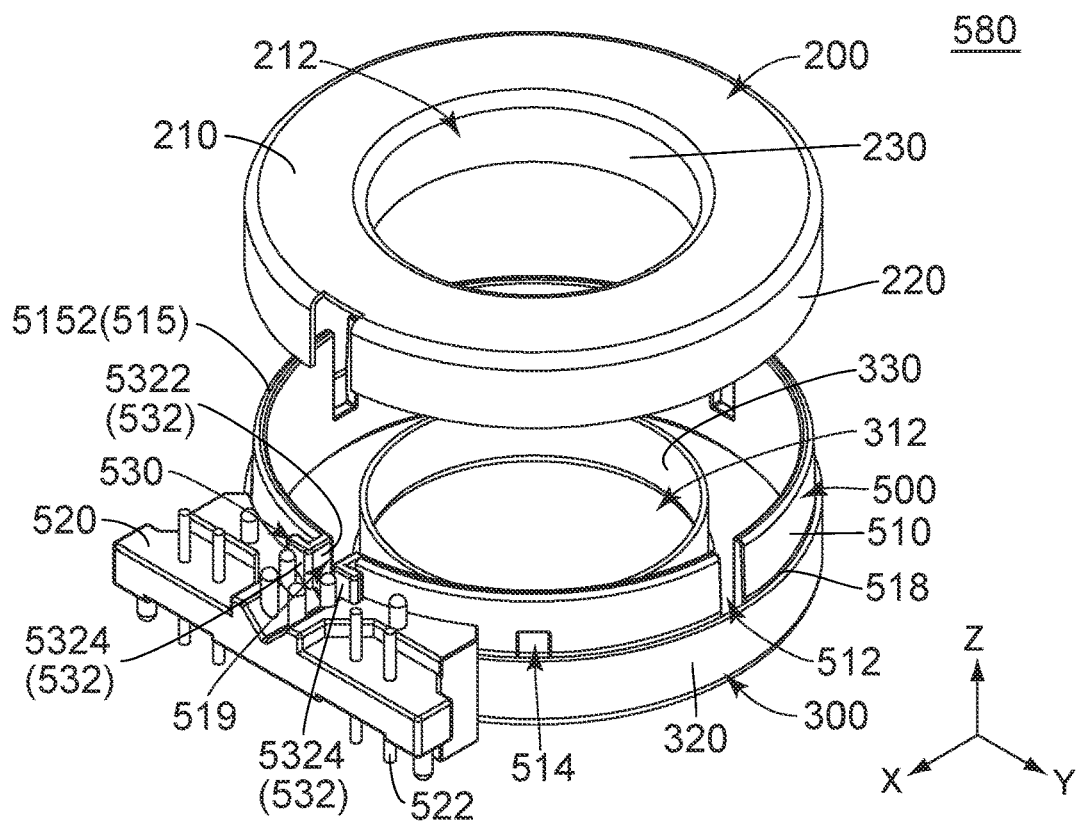
FIG. 19 is another perspective view showing the shield case composite of FIG. 18. In the figure, the lower shield case is press-fit into the press-fit member while the upper shield case is not press-fit into the press-fit member.

As shown in FIG. 17, the main portion 510 of the present embodiment has a cylindrical shape extending in the up-down direction. Referring to FIGS. 17, 19 and 22, the main portion 510 has elasticity and is deformable inward in a radial direction perpendicular to the up-down direction. Specifically, since the main portion 510 has the elasticity, the main portion 510 restores its original shape even if the main portion 510 is deformed inward in the radial direction. In other words, the main portion 510 exhibits a restoring force when an external force in the radial direction is applied to the main portion 510.

Figure 13:
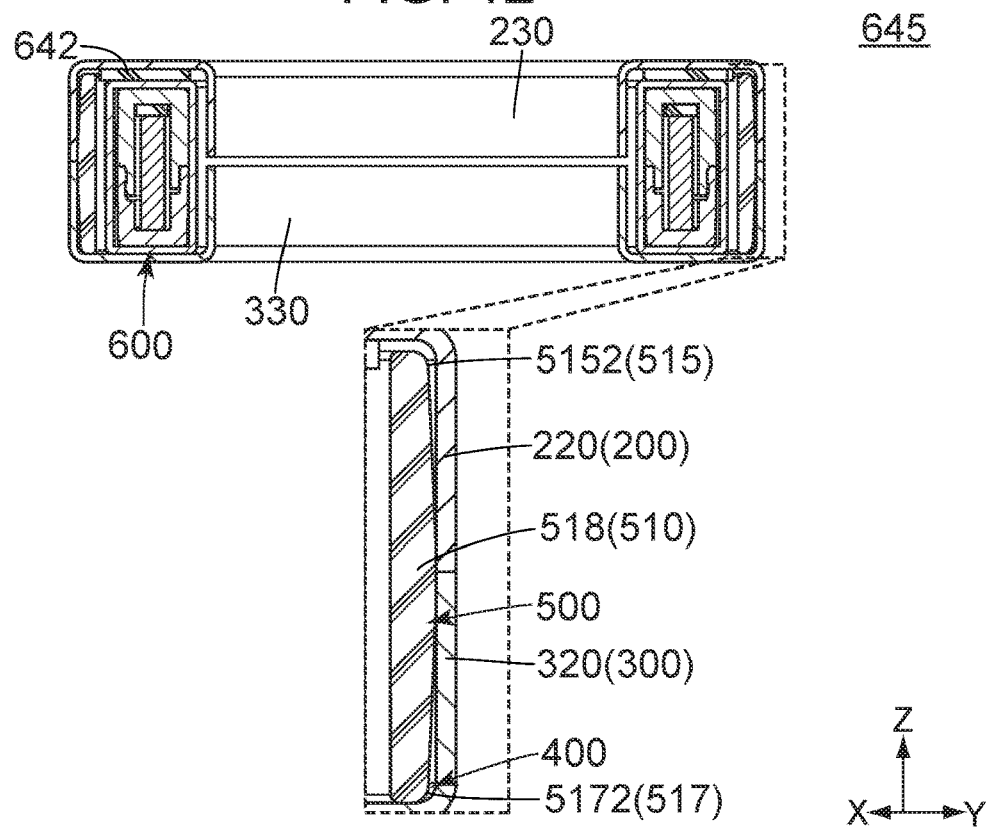
FIG. 13 is a cross-sectional view showing the core component of FIG. 10, taken along line C-C. In the figure, a part of the core component is enlarged and illustrated.
Figure 14:
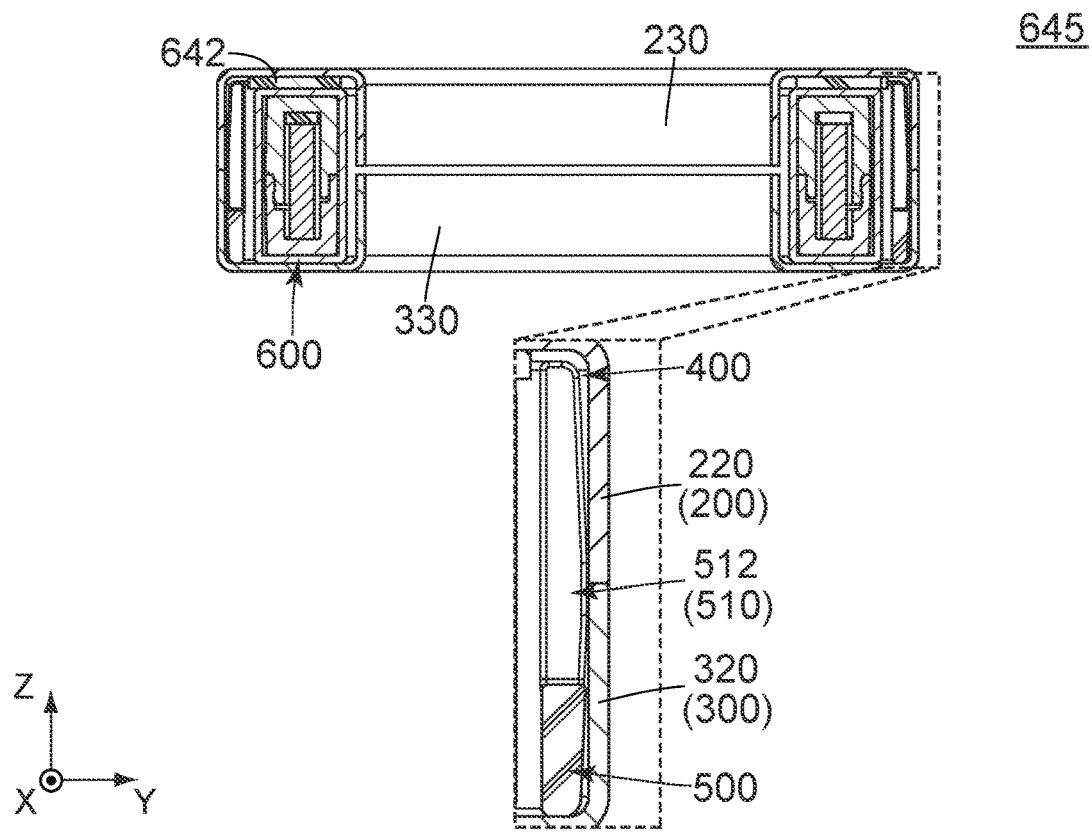
FIG. 14 is a cross-sectional view showing the core component of FIG. 10, taken along line D-D. In the figure, a part of the core component is enlarged and illustrated.

As shown in FIG. 13, the main portion 510 pushes both of the upper outer peripheral portion 220 and the lower outer peripheral portion 320 outward in a horizontal plane perpendicular to the up-down direction to integrally fix the upper shield case 200 and the lower shield case 300 to each other. In other words, the main portion 510 integrally fixes the upper shield case 200 and the lower shield case 300 to each other by the restoring force. The upper shield case 200 and the lower shield case 300 are integrally fixed to each other via the press-fit member 500. Accordingly, the electric current sensor 100 of the present embodiment does not require potting with urethane resin or the like. In the present embodiment, the horizontal plane is an XY-plane. When the upper shield case 200 and the lower shield case 300 are integrally fixed to each other via the press-fit member 500, the electric current sensor 100 of the present embodiment is formed with a gap between the upper inner peripheral portion 230 of the upper shield case 200 and the lower inner peripheral portion 330 of the lower shield case 300 around their entire peripheries so that the upper shield case 200 and the lower shield case 300 do not act as a short-circuit ring. It is noted that, instead of being formed with the gap between the upper inner peripheral portion 230 and the lower inner peripheral portion 330, the electric current sensor 100 may be formed with a gap between the upper outer peripheral portion 220 of the upper shield case 200 and the lower outer peripheral portion 320 of the lower shield case 300.

As shown in FIG. 17, the main portion 510 is formed with upper slits 512 and lower slits 514. By this structure, the inward deformation of the main portion 510 in the radial direction is increased and thereby the press-fit member 500 is easily press-fit into both of the upper shield case 200 and the lower shield case 300.

As shown in FIG. 17, each of the upper slits 512 of the present embodiment extends downward in the up-down direction from an upper end of the main portion 510. It is noted that each of the upper slits 512 does not reach a lower end of the main portion 510.

As shown in FIG. 17, each of the lower slits 514 of the present embodiment extends upward in the up-down direction from the lower end of the main portion 510. It is noted that each of the lower slits 514 does not reach the upper end of the main portion 510.

As shown in FIG. 17, the upper slits 512 and the lower slits 514 are alternately arranged in a circumferential direction of the main portion 510. Since, as described above, each of the upper slits 512 does not reach the lower end of the main portion 510 while each of the lower slits 514 does not reach the upper end of the main portion 510, the main portion 510 is not split by any of the upper slits 512 and lower slits 514 in the circumferential direction.

As shown in FIG. 22, the main portion 510 has an upper guide portion 515, a lower guide portion 517 and a press-fit portion 518.

As shown in FIG. 22, the upper guide portion 515 of the present embodiment is positioned above the press-fit portion 518 in the up-down direction. In the horizontal plane, an upper end 5152 of the upper guide portion 515 has a size S1 smaller than a size of an inner surface of the upper outer peripheral portion 220 of the upper shield case 200. That is, in the horizontal plane, the size S1 of the upper end 5152 of the upper guide portion 515 is smaller than the size SU of the inner surface of the upper outer peripheral portion 220 of the upper shield case 200.

As shown in FIG. 22, in the horizontal plane, the upper end 5152 of the upper guide portion 515 has the size S1 smaller than the size of the inner surface of the upper outer peripheral portion 220 of the upper shield case 200 under a state where the press-fit member 500 is press-fit into both of the upper shield case 200 and the lower shield case 300. That is, in the horizontal plane, the size S1 of the upper end 5152 of the upper guide portion 515 is smaller than the size SU of the inner surface of the upper outer peripheral portion 220 of the upper shield case 200 under the state where the press-fit member 500 is press-fit into both of the upper shield case 200 and the lower shield case 300. The upper end 5152 of the upper guide portion 515 is in non-contact with the inner surface of the upper outer peripheral portion 220 in the radial direction under the state where the press-fit member 500 is press-fit into both of the upper shield case 200 and the lower shield case 300. However, the present invention is not limited thereto, but the upper end 5152 of the upper guide portion 515 may be in contact with the inner surface of the upper outer peripheral portion 220 in the radial direction under the state where the press-fit member 500 is press-fit into both of the upper shield case 200 and the lower shield case 300. Specifically, in the horizontal plane, the upper end 5152 of the upper guide portion 515 may have the size S1 equal to the size of the inner surface of the upper outer peripheral portion 220 of the upper shield case 200 under the state where the press-fit member 500 is press-fit into both of the upper shield case 200 and the lower shield case 300. That is, in the horizontal plane, the size S1 of the upper end 5152 of the upper guide portion 515 may be equal to the size SU of the inner surface of the upper outer peripheral portion 220 of the upper shield case 200 under the state where the press-fit member 500 is press-fit into both of the upper shield case 200 and the lower shield case 300.

As shown in FIG. 22, the lower guide portion 517 of the present embodiment is positioned below the press-fit portion 518 in the up-down direction. In the horizontal plane, a lower end 5172 of the lower guide portion 517 has a size S2 smaller than a size of an inner surface of the lower outer peripheral portion 320 of the lower shield case 300. That is, in the horizontal plane, the size S2 of the lower end 5172 of the lower guide portion 517 is smaller than the size SL of the inner surface of the lower outer peripheral portion 320 of the lower shield case 300.

As shown in FIG. 22, in the horizontal plane, the lower end 5172 of the lower guide portion 517 has the size S2 smaller than the size of the inner surface of the lower outer peripheral portion 320 of the lower shield case 300 under the state where the press-fit member 500 is press-fit into both of the upper shield case 200 and the lower shield case 300. That is, in the horizontal plane, the size S2 of the lower end 5172 of the lower guide portion 517 is smaller than the size SL of the inner surface of the lower outer peripheral portion 320 of the lower shield case 300 under the state where the press-fit member 500 is press-fit into both of the upper shield case 200 and the lower shield case 300. The lower end 5172 of the lower guide portion 517 is in non-contact with the inner surface of the lower outer peripheral portion 320 in the radial direction under the state where the press-fit member 500 is press-fit into both of the upper shield case 200 and the lower shield case 300. However, the present invention is not limited thereto, but the lower end 5172 of the lower guide portion 517 may be in contact with the inner surface of the lower outer peripheral portion 320 in the radial direction under the state where the press-fit member 500 is press-fit into both of the upper shield case 200 and the lower shield case 300. Specifically, in the horizontal plane, the lower end 5172 of the lower guide portion 517 may have the size S2 equal to the size of the inner surface of the lower outer peripheral portion 320 of the lower shield case 300 under the state where the press-fit member 500 is press-fit into both of the upper shield case 200 and the lower shield case 300. That is, in the horizontal plane, the size S2 of the lower end 5172 of the lower guide portion 517 may be equal to the size SL of the inner surface of the lower outer peripheral portion 320 of the lower shield case 300 under the state where the press-fit member 500 is press-fit into both of the upper shield case 200 and the lower shield case 300.

As shown in FIG. 22, the press-fit portion 518 of the present embodiment is positioned between the upper guide portion 515 and the lower guide portion 517 in the up-down direction. The press-fit portion 518 is press-fit into an inside of the upper outer peripheral portion 220. The press-fit portion 518 is press-fit into an inside of the lower outer peripheral portion 320. The press-fit portion 518 is in contact with the inner surface of the upper outer peripheral portion 220 in the radial direction. The press-fit portion 518 is in contact with the inner surface of the lower outer peripheral portion 320 in the radial direction.

As shown in FIG. 22, in the horizontal plane, the press-fit portion 518 has a size SP greater than the size of the upper end 5152 of the upper guide portion 515. That is, in the horizontal plane, the size SP of the press-fit portion 518 is greater than the size S1 of the upper end 5152 of the upper guide portion 515. Additionally, in the horizontal plane, the press-fit portion 518 has the size SP greater than the size of the lower end 5172 of the lower guide portion 517. That is, in the horizontal plane, the size SP of the press-fit portion 518 is greater than the size S2 of the lower end 5172 of the lower guide portion 517.

Referring to FIGS. 17 and 22, in the horizontal plane, the press-fit portion 518 has a size which is greater than any of the size SU of the inner surface of the upper outer peripheral portion 220 of the upper shield case 200 and the size SL of the inner surface of the lower outer peripheral portion 320 of the lower shield case 300 under a state where the press-fit member 500 is not press-fit into any of the upper shield case 200 and the lower shield case 300. This facilitates the press-fitting of the press-fit member 500 into the upper shield case 200 and the lower shield case 300.

As shown in FIG. 19, the main portion 510 is provided with an outlet portion 519.

As shown in FIG. 19, the outlet portion 519 of the present embodiment is a hole which pierces the main portion 510 in the radial direction perpendicular to the up-down direction. The outlet portion 519 is also a ditch extending downward from the upper end of the main portion 510. The outlet portion 519 is the hole piercing the upper guide portion 515 in the radial direction. The outlet portion 519 is the hole piercing the main portion 510 in a front-rear direction perpendicular to the up-down direction. Specifically, the outlet portion 519 is the hole piercing the upper guide portion 515 in the front-rear direction. In the present embodiment, the front-rear direction is an X-direction. Specifically, it is assumed that forward is a positive X-direction while rearward is a negative X-direction.

As shown in FIG. 19, the press-fit member 500 further has a terminal block portion 520 and a coupling portion 530.

Figure 18:
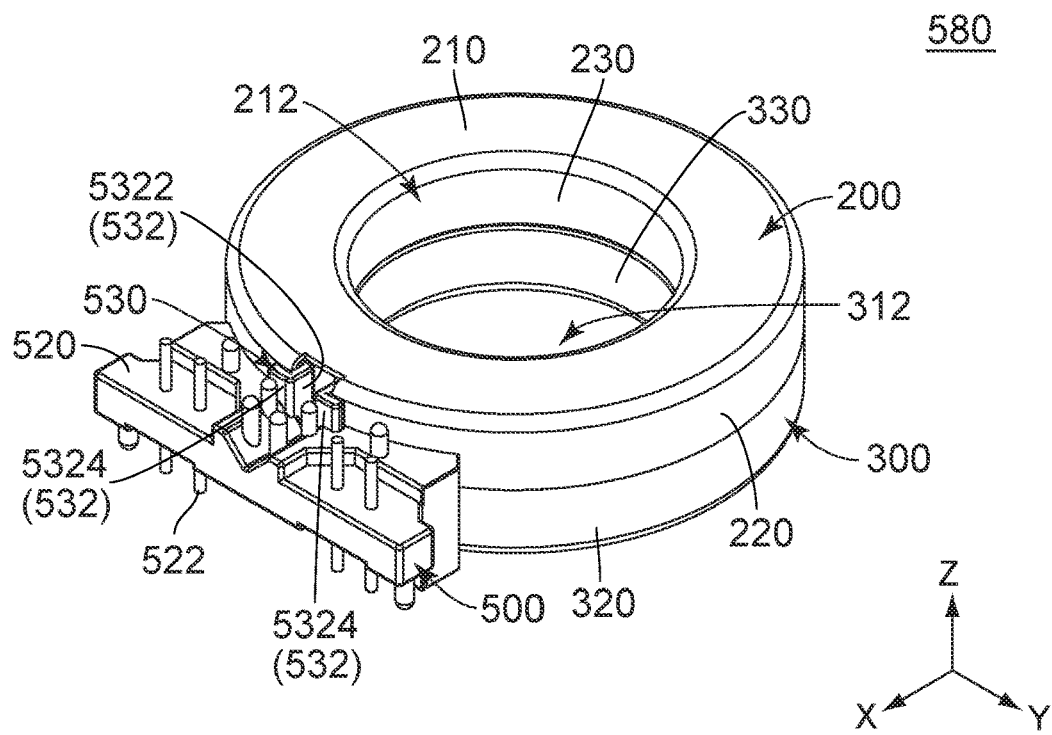
FIG. 18 is a perspective view showing a shield case composite which is included in the core component of FIG. 17. In the figure, an upper shield case and a lower shield case are press-fit into a press-fit member.

As shown in FIG. 18, the terminal block portion 520 of the present embodiment is positioned outward of any of the upper shield case 200 and the lower shield case 300 in the horizontal plane. As shown in FIG. 17, the terminal block portion 520 is positioned outward of the main portion 510 in the radial direction. More in detail, the terminal block portion 520 is positioned forward of the main portion 510 in the front-rear direction. The terminal block portion 520 has a plurality of terminals 522.

Referring to FIG. 18, each of the terminals 522 of the present embodiment is made of metal and pierces the terminal block portion 520 in the up-down direction.

As shown in FIG. 19, the coupling portion 530 of the present embodiment couples the main portion 510 and the terminal block portion 520 with each other. The coupling portion 530 couples the main portion 510 and the terminal block portion 520 with each other in the front-rear direction. As shown in FIGS. 15 and 19, the coupling portion 530 has two reinforcing portions 532 and a positioning portion 534.

As shown in FIG. 20, the reinforcing portions 532 of the present embodiment are positioned at opposite sides, respectively, of the outlet portion 519 in a right-left direction perpendicular to both the up-down direction and the front-rear direction. In the present embodiment, the right-left direction is a Y-direction. Specifically, it is assumed that rightward is a positive Y-direction while leftward is a negative Y-direction. Each of the reinforcing portions 532 has a first wall portion 5322 and a second wall portion 5324.

As shown in FIG. 20, the first wall portion 5322 of the present embodiment extends outward in the horizontal plane from the outlet portion 519. More in detail, the first wall portion 5322 extends forward in the front-rear direction from the outlet portion 519. The first wall portion 5322 has a flat-plate shape extending in the up-down direction. The first wall portion 5322 is perpendicular to the right-left direction. Referring to FIGS. 17 and 20, the first wall portions 5322 of the two reinforcing portions 532 are positioned in the upper communication portion 240 of the upper shield case 200 in the circumferential direction.

As shown in FIG. 20, the second wall portion 5324 of one of the reinforcing portions 532 extends from the first wall portion 5322 so as to be away from a remaining one of the reinforcing portions 532. Additionally, the second wall portion 5324 of the remaining one of the reinforcing portions 532 extends from the first wall portion 5322 so as to be away from the one of the reinforcing portions 532. Specifically, the second wall portion 5324 of the reinforcing portion 532, which is positioned at a right side of the coupling portion 530, extends from the first wall portion 5322 so as to be away from the reinforcing portion 532, which is positioned at a left side of the coupling portion 530, and the second wall portion 5324 of the reinforcing portion 532 at its left side extends from the first wall portion 5322 so as to be away from the reinforcing portion 532 at its right side. More specifically, the second wall portion 5324 of the reinforcing portion 532 at its right side extends rightward from the first wall portion 5322, and the second wall portion 5324 of the reinforcing portion 532 at its left side extends leftward from the first wall portion 5322. The second wall portion 5324 has a flat-plate shape extending in the up-down direction. The second wall portion 5324 is perpendicular to the front-rear direction. In other words, the second wall portion 5324 is perpendicular to a direction in which the first wall portion 5322 extends. This prevents folding and deformation of the coupling portion 530. Referring to FIGS. 17 and 20, the second wall portion 5324 is positioned outward of the upper communication portion 240 of the upper shield case 200 in the circumferential direction. The second wall portion 5324 is positioned outward of the upper shield case 200 in the radial direction. More in detail, the second wall portion 5324 is positioned outward of the upper communication portion 240 of the upper shield case 200 in the radial direction. The second wall portion 5324 is positioned outward of the upper communication portion 240 of the upper shield case 200 in the right-left direction. An inner surface in the circumferential direction of a connection portion of the first wall portion 5322 and the second wall portion 5324 has a rounded corner.

As understood from FIGS. 15 and 19, the positioning portion 534 of the present embodiment is positioned below any of the reinforcing portions 532 in the up-down direction. Referring to FIGS. 15 and 17, the positioning portion 534 is positioned in the lower communication portion 340 of the lower shield case 300 in the circumferential direction. A lower part of the positioning portion 534 extends inward in the radial direction beyond an outer surface of the main portion 510 in the radial direction. This prevents folding of the positioning portion 534.

Figure 11:
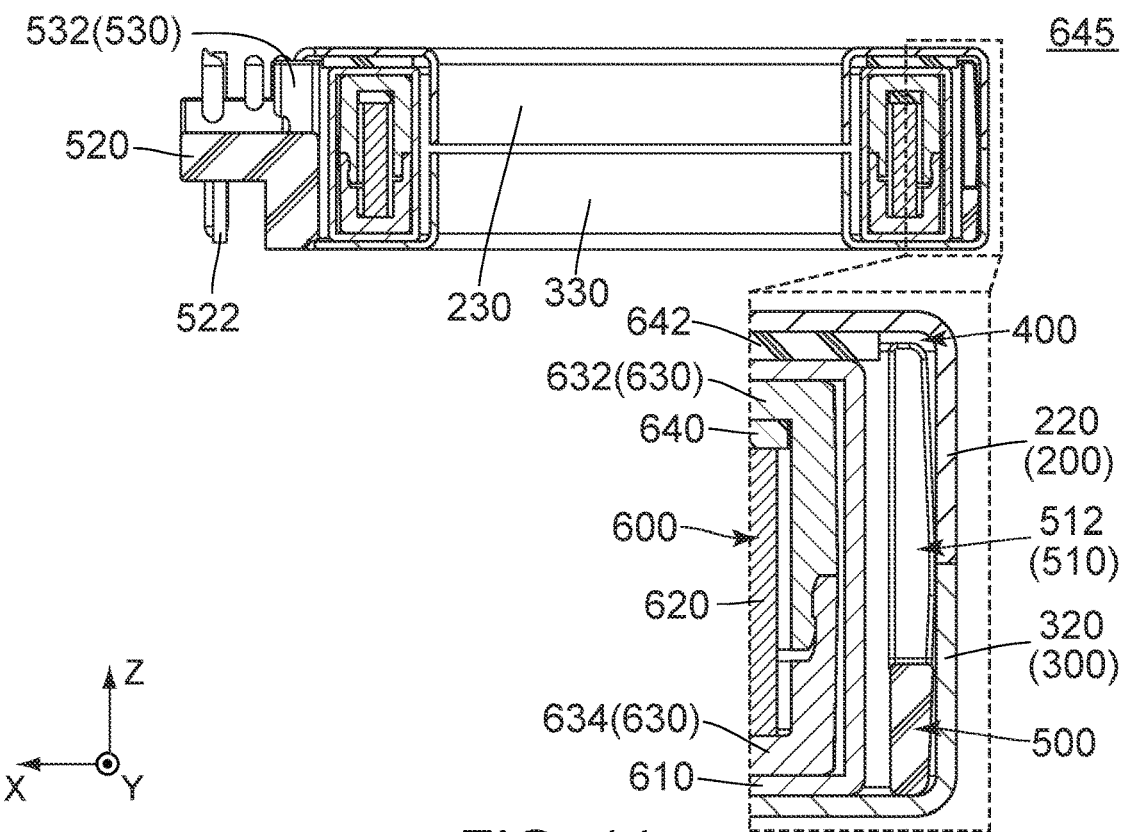
FIG. 11 is a cross-sectional view showing the core component of FIG. 10, taken along line A-A. In the figure, the end portion of the coil is omitted and a part of the core component is enlarged and illustrated.
Figure 12:
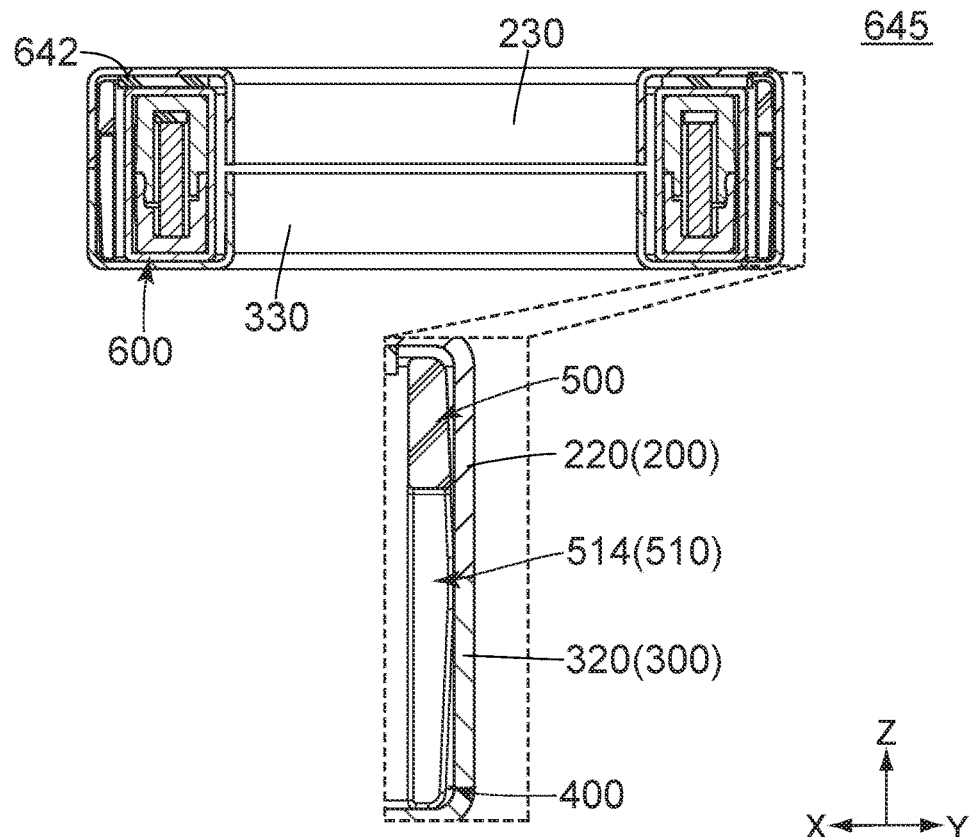
FIG. 12 is a cross-sectional view showing the core component of FIG. 10, taken along line B-B. In the figure, a part of the core component is enlarged and illustrated.

As shown in FIG. 11, the inner member 600 of the present embodiment is positioned between the main portion 510 and any of the inner peripheral portions 230 and 330 in the accommodating portion 400. The inner member 600 is positioned between the main portion 510 and the upper inner peripheral portion 230 in the accommodating portion 400. The inner member 600 is positioned between the main portion 510 and the lower inner peripheral portion 330 in the accommodating portion 400. Referring to FIG. 17, the inner member 600 has an annular ring shape when viewed along the up-down direction. However, the present invention is not limited thereto, but the shape of the inner member 600 is not limited to any particular shape. As shown in FIG. 11 again, the electric current sensor 100 of the present embodiment is configured so that the inner member 600 is in non-contact with the press-fit member 500. However, the present invention is not limited thereto, but the inner member 600 may be in contact with the press-fit member 500. The inner member 600 comprises a coil 610, an electromagnetic core 620, a core case 630 and a core sponge 640.

Figure 10:
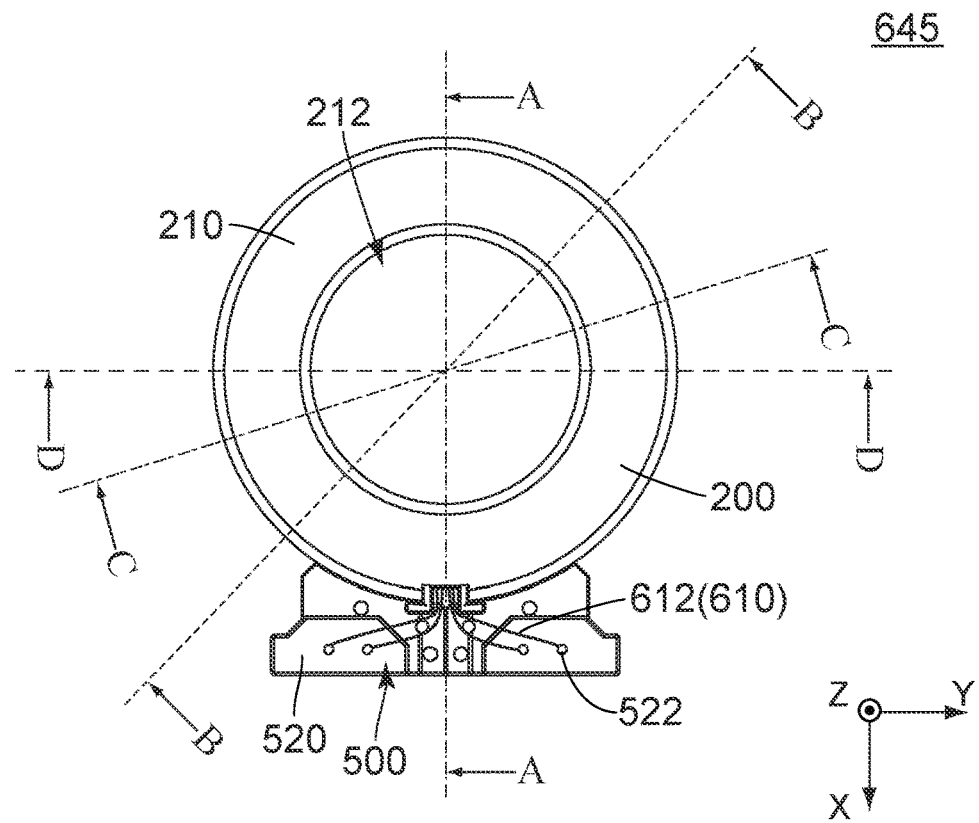
FIG. 10 is a top view showing the core component of FIG. 8.

Referring to FIG. 11. the coil 610 of the present embodiment is wound around the core case 630. As understood from FIGS. 10 and 20, end portions 612 of the coil 610 are pulled outside the electric current sensor 100 through the outlet portion 519. Since the inner surface in the circumferential direction of the connection portion of the first wall portion 5322 and the second wall portion 5324 has the rounded corner as described above, disconnection of the coil 610 is prevented even if the end portion 612 of the coil 610, which is pulled outside the electric current sensor 100 through the outlet portion 519, is brought into contact with the connection portion of the first wall portion 5322 and the second wall portion 5324. The end portions 612 are connected to the terminals 522, respectively, of the terminal block portion 520.

Referring to FIG. 11, the electromagnetic core 620 of the present embodiment is a toroidal core. In other words, the inner member 600 comprises the toroidal core 620 which functions as the electromagnetic core 620. However, the present invention is not limited thereto, but the electromagnetic core 620 may be a core other than the toroidal core.

As shown in FIG. 11, the core case 630 of the present embodiment accommodates the electromagnetic core 620. The core case 630 is composed of an upper core case 632 and a lower core case 634. The upper core case 632 is positioned above the lower core case 634 in the up-down direction.

Referring to FIG. 11, the core sponge 640 of the present embodiment is made of resin. The core sponge 640 is positioned between the upper core case 632 and the electromagnetic core 620 in the up-down direction. Specifically, the electromagnetic core 620 is indirect contact with the upper core case 632 via the core sponge 640. This prevents looseness of the electromagnetic core 620 in the core case 630.

As shown in FIG. 17, the electric current sensor 100 further comprises a sponge 642.

Referring to FIG. 17, the sponge 642 of the present embodiment is made of resin. As shown in FIG. 11, the sponge 642 of the present embodiment is arranged above the inner member 600 in the accommodating portion 400. However, the present invention is not limited thereto, but the sponge 642 is arranged at least one of above and below the inner member 600 in the accommodating portion 400. The sponge 642 is positioned between the upper shield case 200 and the inner member 600 in the up-down direction. The inner member 600 is indirect contact with the upper shield case 200 via the sponge 642. This prevents looseness of the inner member 600 in the accommodating portion 400.

Referring to FIG. 17, the upper shield case 200, the lower shield case 300, the press-fit member 500, the inner member 600 and the sponge 642 form a core component 645.

As shown in FIG. 7, the circuit board 700 of the present embodiment has a plurality of terminal connection portions 710 and a plurality of pin connection portions 720. The terminal connection portion 710 and the pin connection portion 720 are connected to each other through a trace (not shown) which is arranged on the circuit board 700. The terminal connection portion 710 is connected with the terminal 522 of the terminal block portion 520.

Figure 5:
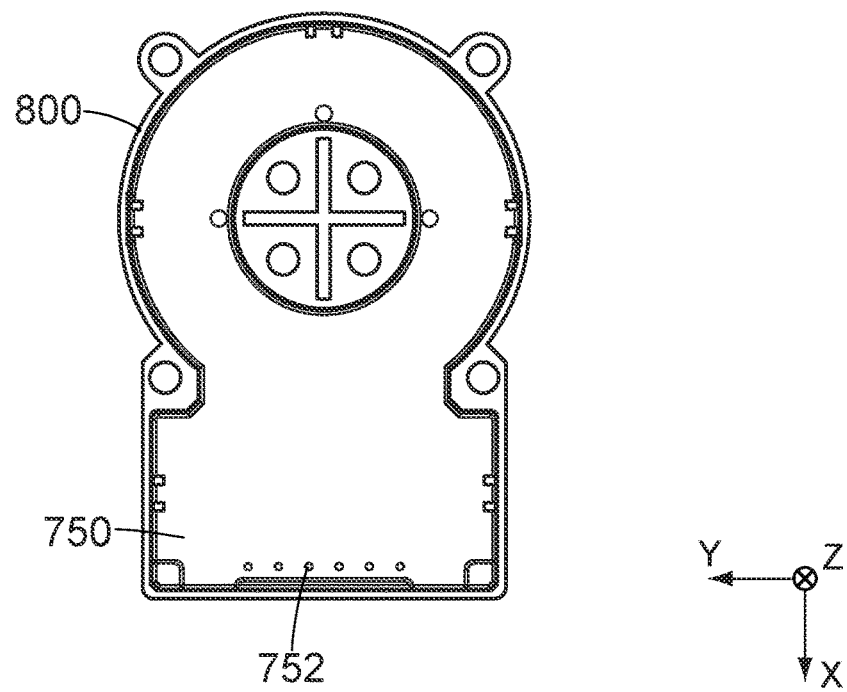
FIG. 5 is a bottom view showing the electric current sensor of FIG. 1.
Figure 6:
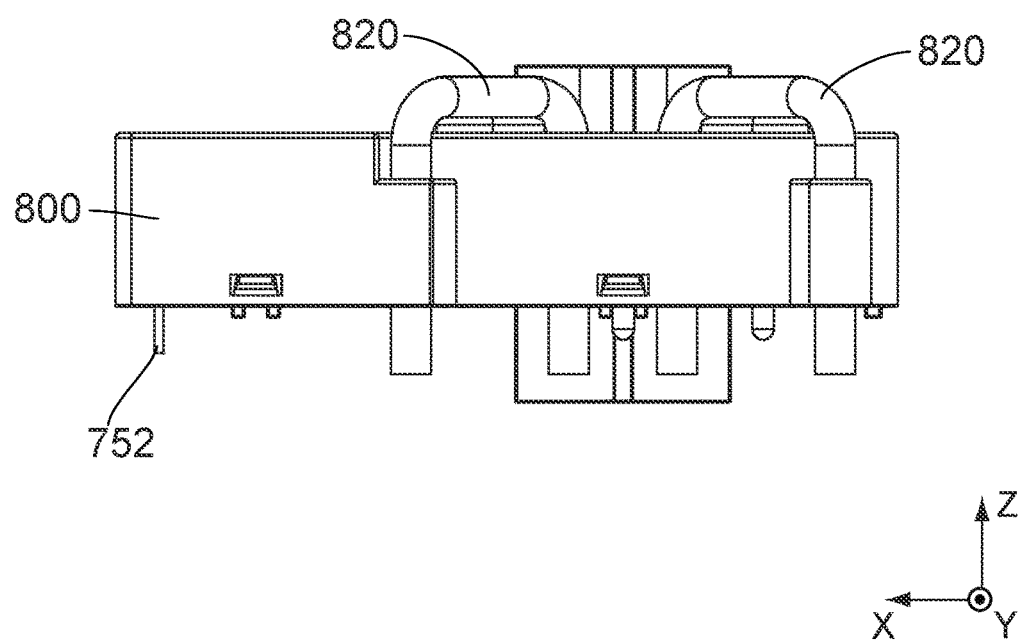
FIG. 6 is a side view showing the electric current sensor of FIG. 1.

Referring to FIGS. 5 and 7, the housing 750 of the present embodiment is made of resin and accommodates the core component 645 and the circuit board 700. The housing 750 has a plurality of pins 752. The pins 752 are connected to the pin connection portions 720, respectively, of the circuit board 700. A lower end of the pin 752 is exposed outside the electric current sensor 100.

As described above, the end portions 612 of the coil 610 are connected to the terminals 522, respectively, of the terminal block portion 520, the terminals 522 of the terminal block portion 520 are connected to the terminal connection portions 710, respectively, of the circuit board 700, and terminal connection portion 710 and the pin connection portion 720 are connected to each other by the trace, and the pin connection portions 720 of the circuit board 700 are connected with the pins 752, respectively, of the housing 750. Accordingly, the end portions 612 of the coil 610 can be electrically connected to the outside of the electric current sensor 100 through the terminals 522, the circuit board 700 and the pins 752.

Referring to FIGS. 5 and 7, the case 800 of the present embodiment is made of resin and is positioned outside the housing 750. The case 800 partially covers the housing 750.

Referring to FIGS. 1 and 7, each of the busbars 820 of the present embodiments is made of metal and is attached to the case 800.

As shown in FIG. 7, the electric current sensor 100 further comprises a case sponge 650.

Referring to FIG. 7. the case sponge 650 of the present embodiment is made of resin. The case sponge 650 is positioned between the case 800 and the core component 645. This prevents looseness of the core component 645 in the case 800.

(Method of Manufacturing the Core Component)

Hereinafter, description will be made in detail about one example of a method of manufacturing the core component 645.

First, the main portion 510 of the press-fit member 500 is inserted into the lower shield case 300 from above, and the main portion 510 of the press-fit member 500 and the lower shield case 300 result in a state shown in FIG. 19. Meanwhile, the press-fit portion 518 is in contact with the upper end of the lower shield case 300 in the radial direction. In other words, the main portion 510 of the press-fit member 500 is press-fit into the lower shield case 300 at that time.

As described above, the size S2 of the lower end 5172 of the lower guide portion 517 is smaller than the size SL of the inner surface of the lower outer peripheral portion 320 of the lower shield case 300 in the horizontal plane, and the size SP of the press-fit portion 518 is greater than the size S2 of the lower end 5172 of the lower guide portion 517 in the horizontal plane. Accordingly, when the main portion 510 of the press-fit member 500 is inserted into the lower shield case 300, the main portion 510 is inserted into the lower shield case 300 without stress in an initial step where the lower end 5172 of the lower guide portion 517 of the main portion 510 is inserted into the lower shield case 300, and the press-fit portion 518 pushes a part around the upper end of the lower shield case 300 outward in the radial direction at a time when the press-fit portion 518 of the main portion 510 reaches a position around the upper end of the lower shield case 300 in the up-down direction.

Next, the inner member 600 is inserted from above into a space which is positioned inward of the main portion 510 in the radial direction. At this time, the end portions 612 of the coil 610 are pulled outside the electric current sensor 100 through the outlet portion 519 of the press-fit member 500. After that, the sponge 642 is arranged above the inner member 600.

The upper shield case 200 is inserted over the main portion 510 of the press-fit member 500 from above in this state, and the upper shield case 200, the lower shield case 300 and the press-fit member 500 result in a state shown in FIG. 7. Meanwhile, the press-fit portion 518 is in contact with the lower end of the upper shield case 200 in the radial direction. That is, the main portion 510 of the press-fit member 500 is press-fit into the upper shield case 200. In this state, the upper shield case 200 and the lower shield case 300 are integrally fixed to each other via the press-fit member 500.

As described above, the size S1 of the upper end 5152 of the upper guide portion 515 is smaller than the size SU of the inner surface of the upper outer peripheral portion 220 of the upper shield case 200 in the horizontal plane while the size SP of the press-fit portion 518 is greater than the size S1 of the upper end 5152 of the upper guide portion 515 in the horizontal plane. Accordingly, when the upper shield case 200 is inserted over the main portion 510 of the press-fit member 500, the upper shield case 200 is inserted over the main portion 510 without stress in an initial step where the upper end 5152 of the upper guide portion 515 of the main portion 510 is inserted into the upper shield case 200, and the press-fit portion 518 pushes a part around the lower end of the upper shield case 200 outward in the radial direction at a time when the press-fit portion 518 of the main portion 510 reaches a position around the lower end of the upper shield case 200 in the up-down direction.

Second Embodiment

Figure 30:
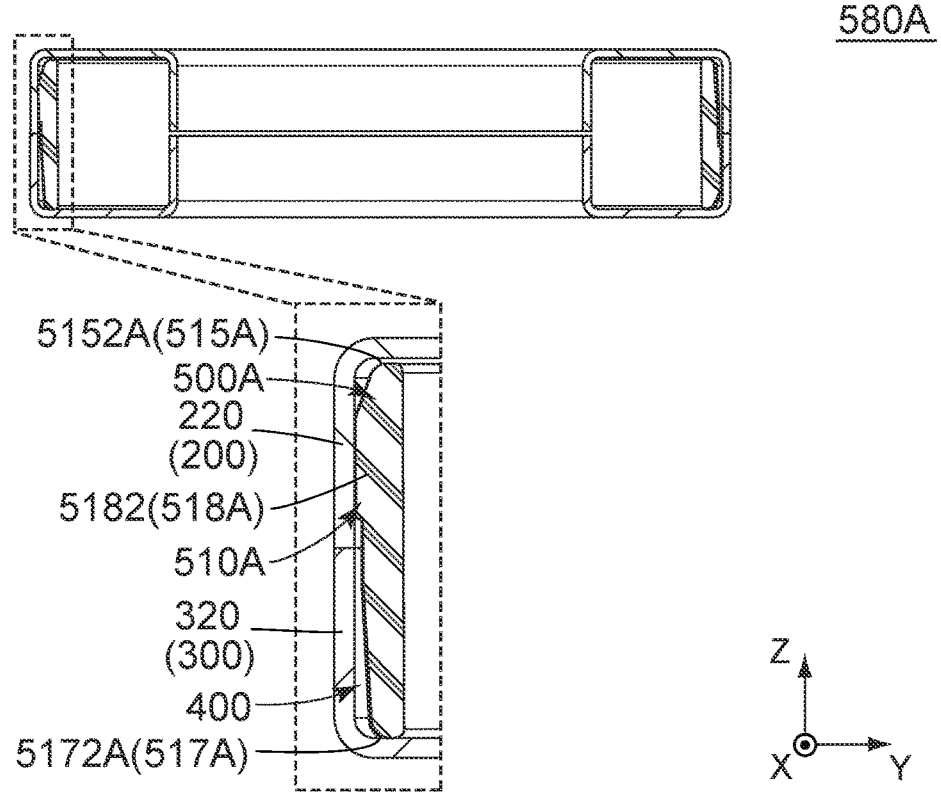
FIG. 30 is a cross-sectional view showing the shield case composite of FIG. 28. In the figure, a part of the shield case composite is enlarged and illustrated.
Figure 31:
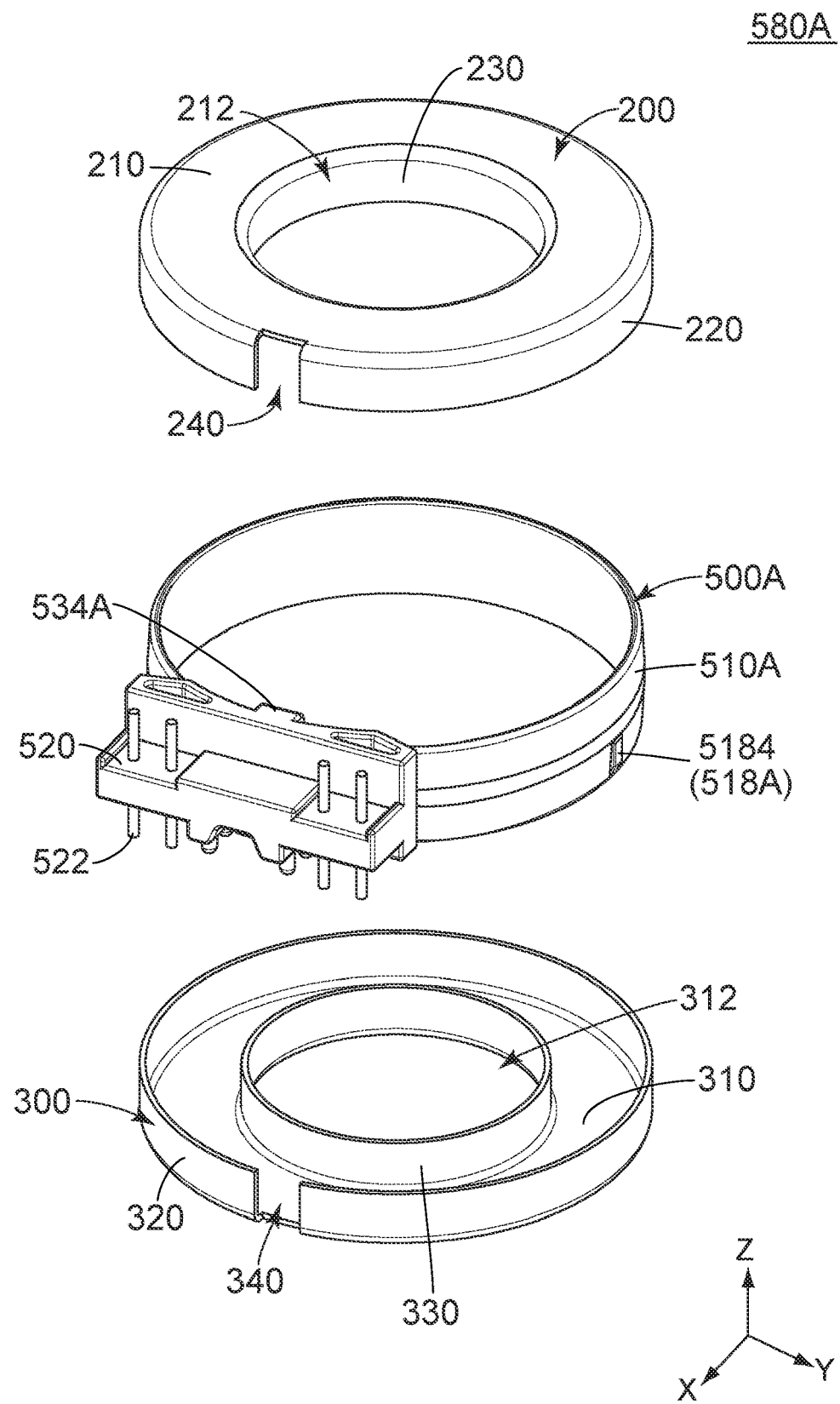
FIG. 31 is an exploded, perspective view showing the shield case composite of FIG. 27.

Referring to FIGS. 7 and 31, an electric current sensor (not shown) according to a second embodiment of the present invention comprises an upper shield case 200, a lower shield case 300, a press-fit member 500A, an inner member 600A, a circuit board 700, a housing 750, a case 800 and busbars 820. It is noted that the upper shield case 200, the lower shield case 300 and the press-fit member 500A form a shield case composite 580A. The electric current sensor of the present embodiment comprises components similar to those of the electric current sensor 100 (see FIGS. 1 and 7) of the aforementioned first embodiment. Accordingly, components of the electric current sensor shown in FIGS. 24 to 33 which are same as those of the first embodiment are referred by using reference signs same as those of the first embodiment. As for directions and orientations in the present embodiment, expressions same as those of the first embodiment will be used hereinbelow.

Figure 25:
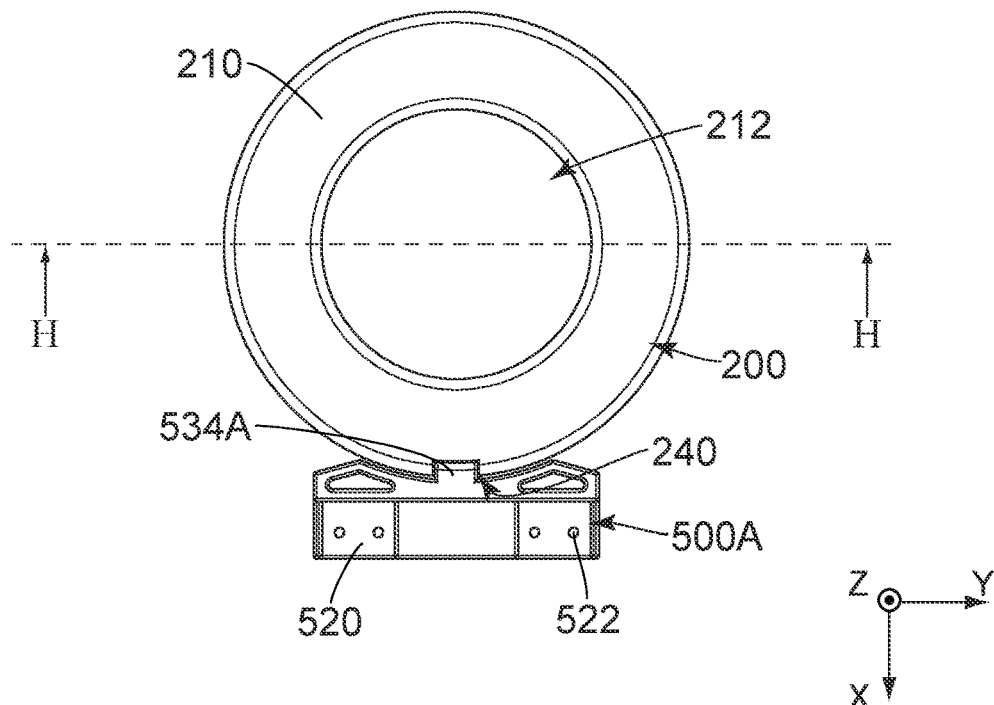
FIG. 25 is a top view showing the core component of FIG. 24.

Referring to FIG. 31, the upper shield case 200 of the present embodiment is made of metal. The upper shield case 200 has an upper surface 210, which has an opening 212 at its inside, an upper outer peripheral portion 220, which extends downward in an up-down direction from an outer edge of the upper surface 210, an upper inner peripheral portion (inner peripheral portion) 230 and an upper communication portion 240. However, the present invention is not limited thereto, but the upper shield case 200 may have no upper inner peripheral portion 230. In other words, the upper shield case 200 should have at least the upper surface 210, which has the opening 212 at its inside, and the upper outer peripheral portion 220 extending downward in the up-down direction from the outer edge of the upper surface 210. As shown in FIG. 25, the upper shield case 200 has an annular ring shape when viewed along the up-down direction. However, the present invention is not limited thereto, but the shape of the upper shield case 200 is not limited to any particular shape. It is noted that the upper shield case 200 can be manufactured from a soft magnetic material such as permalloy, silicon steel, or pure iron.

Referring to FIG. 25, the upper surface 210 of the present embodiment is perpendicular to the up-down direction. The upper surface 210 has an annular ring shape with an axis parallel to the up-down direction. However, the present invention is not limited thereto, but the shape of the upper surface 210 is not limited to any particular shape.

Referring to FIG. 25, the opening 212 of the present embodiment has a circular shape with an axis parallel to the up-down direction. However, the present invention is not limited thereto, but the shape of the opening 212 is not limited to any particular shape. The upper surface 210 and the opening 212 are positioned on the common axis. The opening 212 is positioned inward of the upper surface 210 in a radial direction of the axis of the upper surface 210.

Referring to FIG. 31, the upper outer peripheral portion 220 of the present embodiment extends downward in the up-down direction from the outer edge of the upper surface 210 in the radial direction.

Referring to FIG. 31, the upper inner peripheral portion 230 of the present embodiment extends downward in the up-down direction from an inner edge of the upper surface 210 in the radial direction. The upper inner peripheral portion 230 is positioned outward of the opening 212 in the radial direction. The inner peripheral portion 230 extends along the up-down direction from the opening 212.

Referring to FIG. 31, the upper communication portion 240 of the present embodiment is an aperture which pierces the upper outer peripheral portion 220 in the radial direction perpendicular to the up-down direction. The upper outer peripheral portion 220 is split by the upper communication portion 240 in a circumferential direction of the axis of the upper surface 210. In other words, continuity of the upper outer peripheral portion 220 in the circumferential direction of the upper surface 210 is broken by the upper communication portion 240.

Referring to FIG. 31, the lower shield case 300 of the present embodiment is made of metal. The lower shield case 300 has a lower surface 310, which has an opening 312 at its inside, a lower outer peripheral portion 320, which extends upward in the up-down direction from an outer edge of the lower surface 310, a lower inner peripheral portion (inner peripheral portion) 330 and a lower communication portion 340. However, the present invention is not limited thereto, but the lower shield case 300 may have no lower inner peripheral portion 330. In other words, the lower shield case 300 should have at least the lower surface 310, which has the opening 312 at its inside, and the lower outer peripheral portion 320 extending upward in the up-down direction from the outer edge of the lower surface 310. The lower shield case 300 has an annular ring shape when viewed along the up-down direction. However, the present invention is not limited thereto, but the shape of the lower shield case 300 is not limited to any particular shape. It is noted that the lower shield case 300 can be manufactured from a soft magnetic material such as permalloy, silicon steel, or pure iron.

Referring to FIG. 31, the lower surface 310 of the present embodiment is perpendicular to the up-down direction. The lower surface 310 has an annular ring shape with an axis parallel to the up-down direction. However, the present invention is not limited thereto, but the shape of the lower surface 310 is not limited to any particular shape.

Referring to FIG. 31, the opening 312 of the present embodiment has a circular shape with an axis parallel to the up-down direction. However, the present invention is not limited thereto, but the shape of the opening 312 is not limited to any particular shape. The lower surface 310 and the opening 312 are positioned on the common axis. The opening 312 is positioned inward of the lower surface 310 in a radial direction of the axis of the lower surface 310.

Referring to FIG. 31, the lower outer peripheral portion 320 of the present embodiment extends upward in the up-down direction from the outer edge of the lower surface 310 in the radial direction.

Referring to FIG. 31, the lower inner peripheral portion 330 of the present embodiment extends upward in the up-down direction from an inner edge of the lower surface 310 in the radial direction. The lower inner peripheral portion 330 is positioned outward of the opening 312 in the radial direction. The inner peripheral portion 330 extends along the up-down direction from the opening 312.

Referring to FIG. 31, the lower communication portion 340 of the present embodiment is an aperture which pierces the lower outer peripheral portion 320 in the radial direction. The lower outer peripheral portion 320 is split by the lower communication portion 340 in a circumferential direction of the axis of the lower surface 310. In other words, continuity of the lower outer peripheral portion 320 in the circumferential direction of the lower surface 310 is broken by the lower communication portion 340.

Although, as described above, the upper shield case 200 has the inner peripheral portion 230 extending along the up-down direction from the opening 212 while the lower shield case 300 has the inner peripheral portion 330 extending along the up-down direction from the opening 312, the present invention is not limited thereto. Specifically, at least one of the upper shield case 200 and the lower shield case 300 should have the inner peripheral portion 230, 330 which extends along the up-down direction from the opening 212, 312 of the at least one of the upper shield case 200 and the lower shield case 300.

Figure 29:
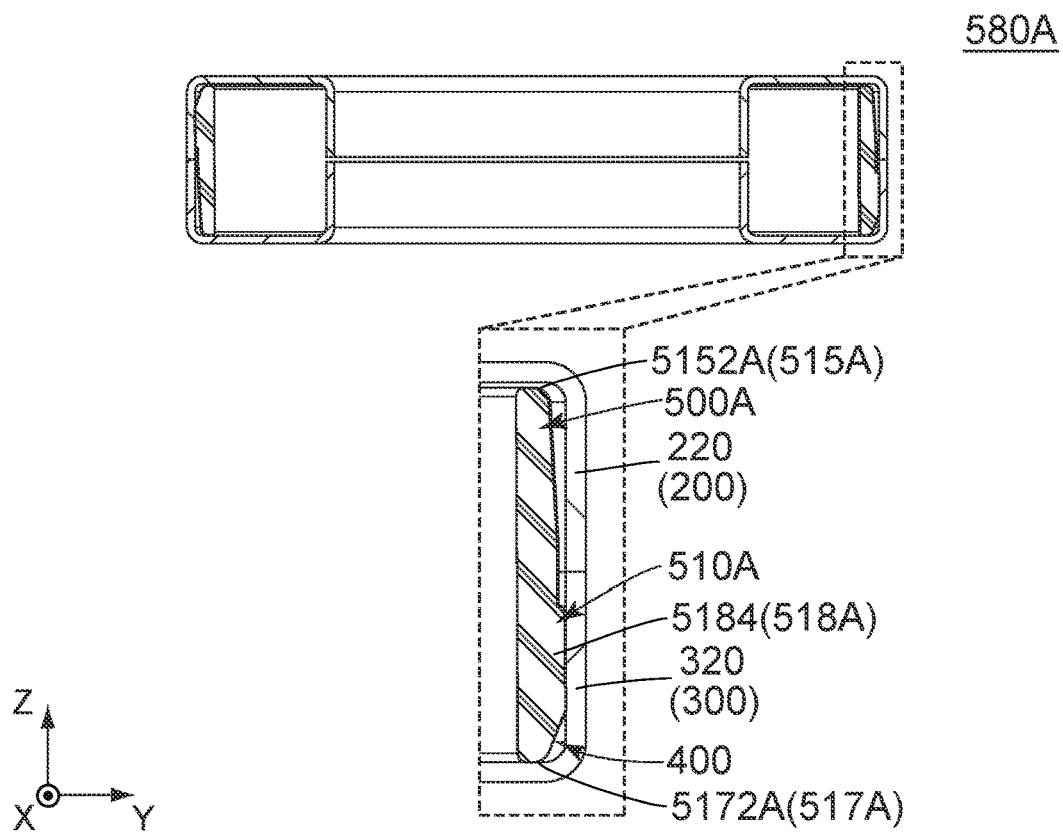
FIG. 29 is a cross-sectional view showing the shield case composite of FIG. 28. In the figure, a part of the shield case composite is enlarged and illustrated.

As shown in FIG. 29, the upper shield case 200 and the lower shield case 300 form an accommodating portion 400. The accommodating portion 400 is a ring-shaped space with an axis parallel to the up-down direction.

Referring to FIG. 30, the press-fit member 500A of the present embodiment is made of resin. The press-fit member 500A is press-fit into the upper shield case 200. Additionally, as shown in FIG. 29, the press-fit member 500A is press-fit into the lower shield case 300. The press-fit member 500A has a main portion 510A.

Figure 32:
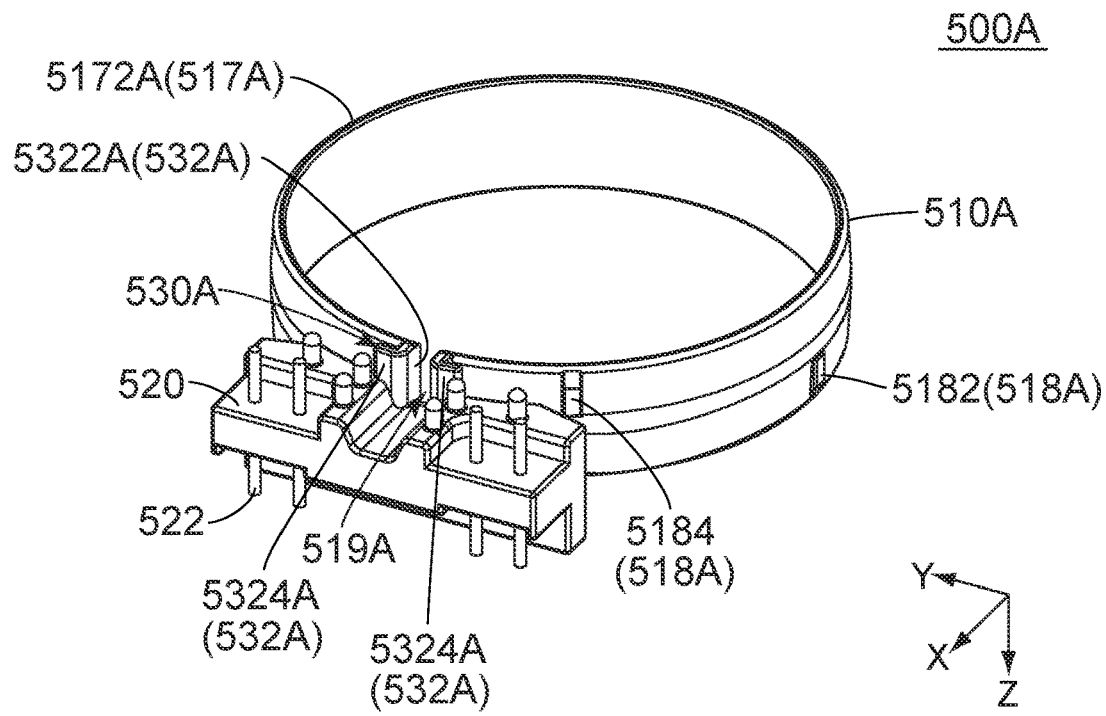
FIG. 32 is a perspective view showing the press-fit member which is included in the shield case composite of FIG. 31.

As shown in FIG. 32, the main portion 510A of the present embodiment has a cylindrical shape extending in the up-down direction. The main portion 510A has elasticity and is deformable inward in a radial direction perpendicular to the up-down direction. Specifically, since the main portion 510A has the elasticity, the main portion 510A restores its original shape even if the main portion 510A is deformed inward in the radial direction. In other words, the main portion 510A exhibits a restoring force when an external force in the radial direction is applied to the main portion 510A.

As shown in FIGS. 29 and 30, the main portion 510A pushes both of the upper outer peripheral portion 220 and the lower outer peripheral portion 320 outward in a horizontal plane perpendicular to the up-down direction to integrally fix the upper shield case 200 and the lower shield case 300 to each other. In other words, the main portion 510A integrally fixes the upper shield case 200 and the lower shield case 300 to each other by the restoring force. The upper shield case 200 and the lower shield case 300 are integrally fixed to each other via the press-fit member 500A. Accordingly, the electric current sensor of the present embodiment does not require potting with urethane resin or the like. When the upper shield case 200 and the lower shield case 300 are integrally fixed to each other via the press-fit member 500A, the electric current sensor of the present embodiment is formed with a gap between the upper inner peripheral portion 230 of the upper shield case 200 and the lower inner peripheral portion 330 of the lower shield case 300 around their entire peripheries so that the upper shield case 200 and the lower shield case 300 do not act as a short-circuit ring. It is noted that, instead of being formed with the gap between the upper inner peripheral portion 230 and the lower inner peripheral portion 330, the electric current sensor may be formed with a gap between the upper outer peripheral portion 220 of the upper shield case 200 and the lower outer peripheral portion 320 of the lower shield case 300.

Figure 33:
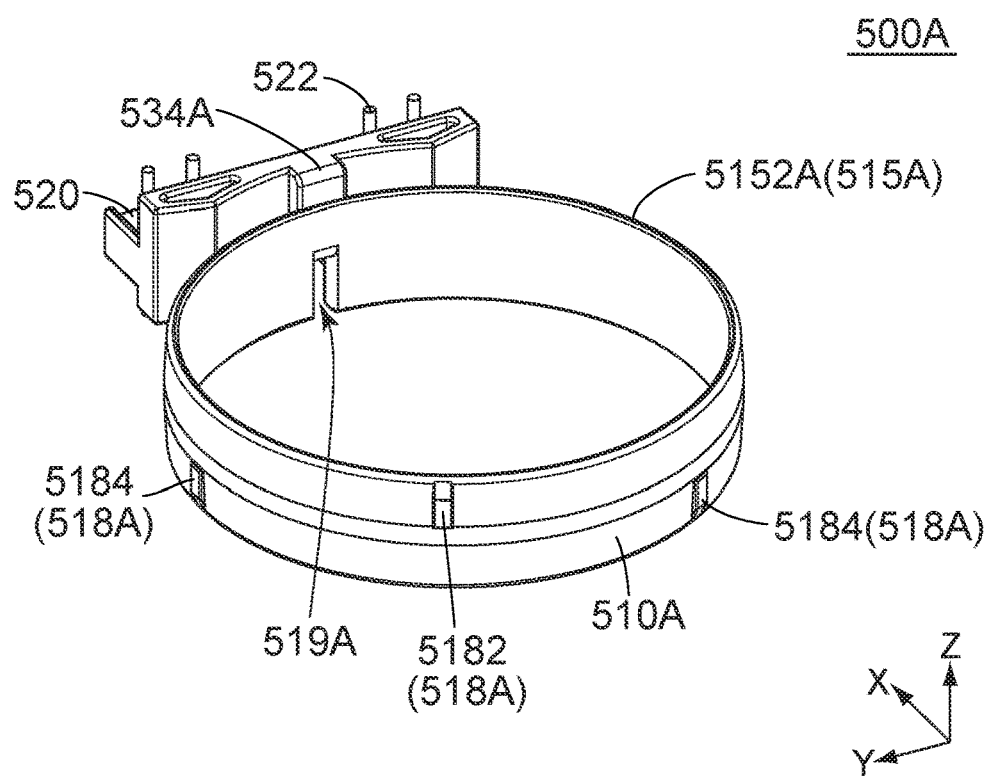
FIG. 33 is another perspective view showing the press-fit member of FIG. 32.
Figure 34:
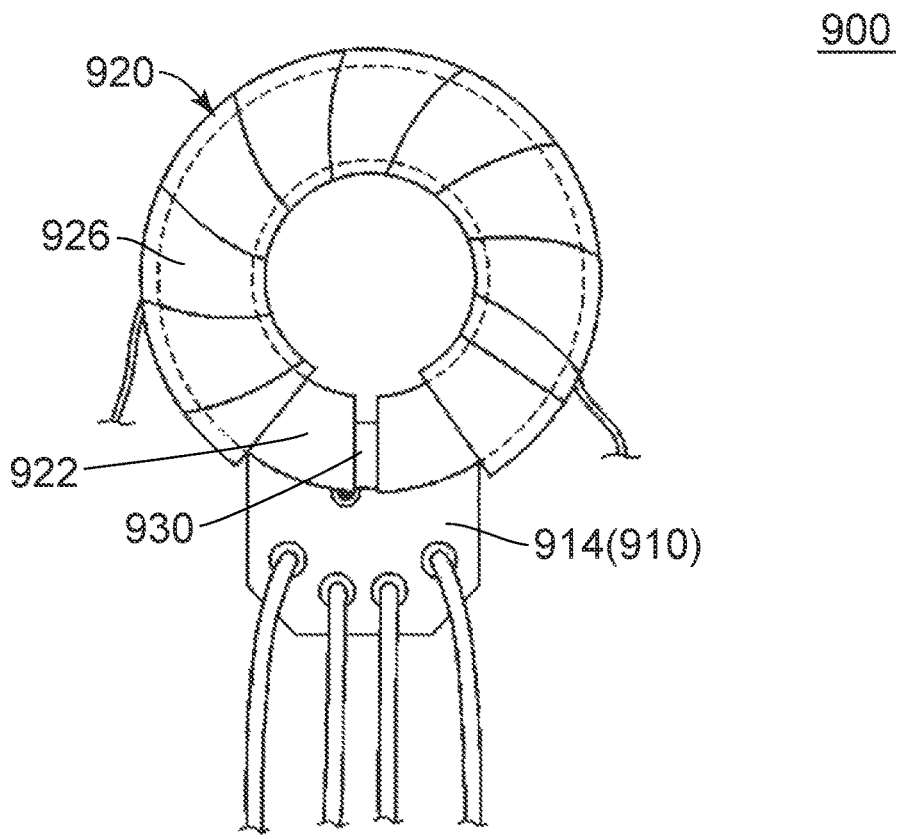
FIG. 34 is a top view showing an electric current sensor of Patent Document 1.
Figure 35:
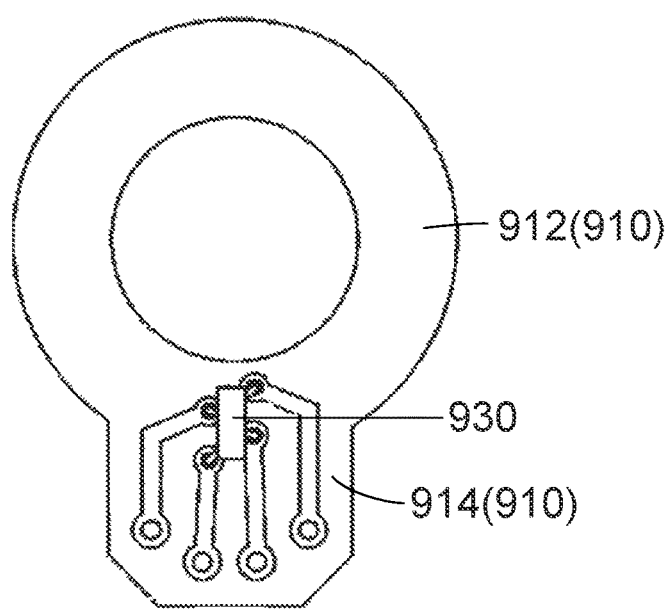
FIG. 35 is a top view showing a circuit board and a hall element which are included in the electric current sensor of FIG. 34.

As shown in FIGS. 32 and 33, dissimilar to the main portion 510 of the first embodiment, the main portion 510A of the present embodiment is formed with no slit. However, the present invention is not limited thereto. Specifically, the main portion 510A may be formed with a slit.

As shown in FIGS. 29 and 30, the main portion 510A has an upper guide portion 515A, a lower guide portion 517A and a press-fit portion 518A.

Figure 28:
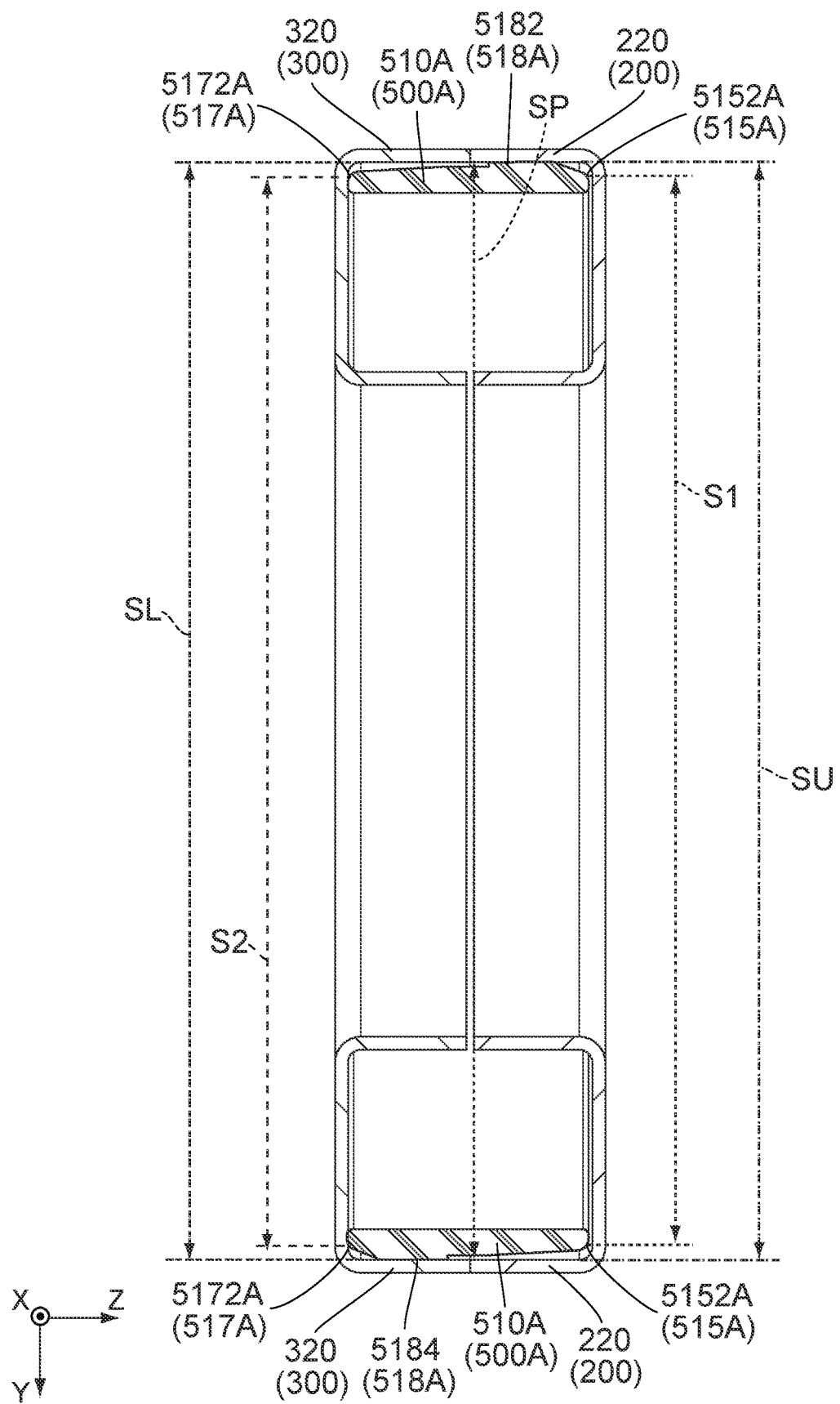
FIG. 28 is a cross-sectional view showing the shield case composite of FIG. 27, taken along line I-I.

As shown in FIG. 28, the upper guide portion 515A of the present embodiment is positioned above the press-fit portion 518A in the up-down direction. In the horizontal plane, an upper end 5152A of the upper guide portion 515A has a size S1 smaller than a size of an inner surface of the upper outer peripheral portion 220 of the upper shield case 200. That is, in the horizontal plane, the size S1 of the upper end 5152A of the upper guide portion 515A is smaller than the size SU of the inner surface of the upper outer peripheral portion 220 of the upper shield case 200.

As shown in FIG. 28, in the horizontal plane, the upper end 5152A of the upper guide portion 515A has the size S1 smaller than the size of the inner surface of the upper outer peripheral portion 220 of the upper shield case 200 under a state where the press-fit member 500A is press-fit into both of the upper shield case 200 and the lower shield case 300. That is, in the horizontal plane, the size S1 of the upper end 5152A of the upper guide portion 515A is smaller than the size SU of the inner surface of the upper outer peripheral portion 220 of the upper shield case 200 under the state where the press-fit member 500A is press-fit into both of the upper shield case 200 and the lower shield case 300. The upper end 5152A of the upper guide portion 515A is in non-contact with the inner surface of the upper outer peripheral portion 220 in the radial direction under the state where the press-fit member 500A is press-fit into both of the upper shield case 200 and the lower shield case 300. However, the present invention is not limited thereto, but the upper end 5152A of the upper guide portion 515A may be in contact with the inner surface of the upper outer peripheral portion 220 in the radial direction under the state where the press-fit member 500A is press-fit into both of the upper shield case 200 and the lower shield case 300. Specifically, in the horizontal plane, the upper end 5152A of the upper guide portion 515A may have the size S1 equal to the size of the inner surface of the upper outer peripheral portion 220 of the upper shield case 200 under the state where the press-fit member 500A is press-fit into both of the upper shield case 200 and the lower shield case 300. That is, in the horizontal plane, the size S1 of the upper end 5152A of the upper guide portion 515A may be equal to the size SU of the inner surface of the upper outer peripheral portion 220 of the upper shield case 200 under the state where the press-fit member 500A is press-fit into both of the upper shield case 200 and the lower shield case 300.

As shown in FIG. 28, the lower guide portion 517A of the present embodiment is positioned below the press-fit portion 518A in the up-down direction. In the horizontal plane, a lower end 5172A of the lower guide portion 517A has a size S2 smaller than a size of an inner surface of the lower outer peripheral portion 320 of the lower shield case 300. That is, in the horizontal plane, the size S2 of the lower end 5172A of the lower guide portion 517A is smaller than the size SL of the inner surface of the lower outer peripheral portion 320 of the lower shield case 300.

As shown in FIG. 28, in the horizontal plane, the lower end 5172A of the lower guide portion 517A has the size S2 smaller than the size of the inner surface of the lower outer peripheral portion 320 of the lower shield case 300 under the state where the press-fit member 500A is press-fit into both of the upper shield case 200 and the lower shield case 300. That is, in the horizontal plane, the size S2 of the lower end 5172A of the lower guide portion 517A is smaller than the size SL of the inner surface of the lower outer peripheral portion 320 of the lower shield case 300 under the state where the press-fit member 500A is press-fit into both of the upper shield case 200 and the lower shield case 300. The lower end 5172A of the lower guide portion 517A is in non-contact with the inner surface of the lower outer peripheral portion 320 in the radial direction under the state where the press-fit member 500A is press-fit into both of the upper shield case 200 and the lower shield case 300. However, the present invention is not limited thereto, but the lower end 5172A of the lower guide portion 517A may be in contact with the inner surface of the lower outer peripheral portion 320 in the radial direction under the state where the press-fit member 500A is press-fit into both of the upper shield case 200 and the lower shield case 300. Specifically, in the horizontal plane, the lower end 5172A of the lower guide portion 517A may have the size S2 equal to the size of the inner surface of the lower outer peripheral portion 320 of the lower shield case 300 under the state where the press-fit member 500A is press-fit into both of the upper shield case 200 and the lower shield case 300. That is, in the horizontal plane, the size S2 of the lower end 5172A of the lower guide portion 517A may be equal to the size SL of the inner surface of the lower outer peripheral portion 320 of the lower shield case 300 under the state where the press-fit member 500A is press-fit into both of the upper shield case 200 and the lower shield case 300.

As shown in FIG. 28, the press-fit portion 518A of the present embodiment is positioned between the upper guide portion 515A and the lower guide portion 517A in the up-down direction. The press-fit portion 518A is press-fit into an inside of the upper outer peripheral portion 220. The press-fit portion 518A is press-fit into an inside of the lower outer peripheral portion 320. The press-fit portion 518A is in contact with the inner surface of the upper outer peripheral portion 220 in the radial direction. The press-fit portion 518A is in contact with the inner surface of the lower outer peripheral portion 320 in the radial direction.

As shown in FIG. 28, in the horizontal plane, the press-fit portion 518A has a size SP greater than the size of the upper end 5152A of the upper guide portion 515A. That is, in the horizontal plane, the size SP of the press-fit portion 518A is greater than the size S1 of the upper end 5152A of the upper guide portion 515A. Additionally, in the horizontal plane, the press-fit portion 518A has the size SP greater than the size of the lower end 5172A of the lower guide portion 517A. That is, in the horizontal plane, the size SP of the press-fit portion 518A is greater than the size S2 of the lower end 5172A of the lower guide portion 517A.

Referring to FIGS. 28 and 31, in the horizontal plane, the press-fit portion 518A has a size which is greater than any of the size SU of the inner surface of the upper outer peripheral portion 220 of the upper shield case 200 and the size SL of the inner surface of the lower outer peripheral portion 320 of the lower shield case 300 under a state where the press-fit member 500A is not press-fit into any of the upper shield case 200 and the lower shield case 300. This facilitates the press-fitting of the press-fit member 500A into the upper shield case 200 and the lower shield case 300.

As shown in FIGS. 32 and 33, the press-fit portion 518A of the present embodiment has a plurality of upper protrusions 5182 and a plurality of lower protrusions 5184.

As shown in FIG. 33, each of the upper protrusions 5182 of the present embodiment protrudes outward in the radial direction. Each of the upper protrusions 5182 defines an outer end of the main portion 510A in the radial direction. Each of the upper protrusions 5182 is positioned above any of the lower protrusions 5184 in the up-down direction. As shown in FIG. 30, the upper protrusion 5182 is in contact with the upper outer peripheral portion 220 of the upper shield case 200 in the radial direction under the state where the press-fit member 500A is press-fit into both of the upper shield case 200 and the lower shield case 300. More in detail, each of the upper protrusions 5182 is in contact with the upper outer peripheral portion 220 of the upper shield case 200 in the radial direction on the inside of the upper outer peripheral portion 220 under the state where the press-fit member 500A is press-fit into both of the upper shield case 200 and the lower shield case 300. Each of the upper protrusions 5182 is in contact with only the upper outer peripheral portion 220 of the upper shield case 200 in the radial direction under the state where the press-fit member 500A is press-fit into both of the upper shield case 200 and the lower shield case 300. In other words, each of the upper protrusions 5182 is in non-contact with the lower outer peripheral portion 320 of the lower shield case 300 in the radial direction under the state where the press-fit member 500A is press-fit into both of the upper shield case 200 and the lower shield case 300.

As shown in FIG. 33, each of the lower protrusions 5184 of the present embodiment protrudes outward in the radial direction. Each of the lower protrusions 5184 defines the outer end of the main portion 510A in the radial direction. Each of the lower protrusions 5184 is positioned below any of the upper protrusions 5182 in the up-down direction. As shown in FIG. 29, the lower protrusion 5184 is in contact with the lower outer peripheral portion 320 of the lower shield case 300 in the radial direction under the state where the press-fit member 500A is press-fit into both of the upper shield case 200 and the lower shield case 300. More in detail, each of the lower protrusions 5184 is in contact with the lower outer peripheral portion 320 of the lower shield case 300 in the radial direction on the inside of the lower outer peripheral portion 320 under the state where the press-fit member 500A is press-fit into both of the upper shield case 200 and the lower shield case 300. Each of the lower protrusions 5184 is in contact with only the lower outer peripheral portion 320 of the lower shield case 300 in the radial direction under the state where the press-fit member 500A is press-fit into both of the upper shield case 200 and the lower shield case 300. In other words, each of the lower protrusions 5184 is in non-contact with the upper outer peripheral portion 220 of the upper shield case 200 in the radial direction under the state where the press-fit member 500A is press-fit into both of the upper shield case 200 and the lower shield case 300.

As described above, the press-fit portion 518A of the present embodiment has the plurality of upper protrusions 5182 and the plurality of lower protrusions 5184. By this configuration, the press-fit member 500A of the present embodiment has an increased strength as compared with the press-fit member 500 of the first embodiment which is formed with the upper slits 512 and the lower slits 514. Additionally, by this configuration, the press-fit member 500A of the present embodiment generates further increased pressing forces against the upper outer peripheral portion 220 of the upper shield case 200 and the lower outer peripheral portion 320 of the lower shield case 300 as compared with the press-fit member 500 of the first embodiment which is formed with the upper slits 512 and the lower slits 514. Since it is easy to mold the press-fit member 500A of the present embodiment as compared with the press-fit member 500 of the first embodiment which is formed with the upper slits 512 and the lower slits 514, the press-fit member 500A of the present embodiment is also advantageous in terms of component costs.

As shown in FIG. 32, the main portion 510A is provided with an outlet portion 519A.

As shown in FIG. 32, the outlet portion 519A of the present embodiment is a hole which pierces the main portion 510A in the radial direction perpendicular to the up-down direction. The outlet portion 519A is also a ditch extending upward from the lower end of the main portion 510A. The outlet portion 519A is the hole piercing the lower guide portion 517A in the radial direction. The outlet portion 519A is the hole piercing the main portion 510A in the front-rear direction perpendicular to the up-down direction. Specifically, the outlet portion 519A is the hole piercing the lower guide portion 517A in the front-rear direction.

As shown in FIG. 32, the press-fit member 500A further has a terminal block portion 520 and a coupling portion 530A. The terminal block portion 520 of the present embodiment has a structure similar to that of the terminal block portion 520 of the first embodiment. Accordingly, a detailed explanation thereabout is omitted.

As shown in FIG. 32, the coupling portion 530A of the present embodiment couples the main portion 510A and the terminal block portion 520 with each other. The coupling portion 530A couples the main portion 510A and the terminal block portion 520 with each other in the front-rear direction. As shown in FIGS. 32 and 33, the coupling portion 530A has two reinforcing portions 532A and a positioning portion 534A.

As shown in FIG. 32, the reinforcing portions 532A of the present embodiment are positioned at opposite sides, respectively, of the outlet portion 519A in the right-left direction perpendicular to both the up-down direction and the front-rear direction. Each of the reinforcing portions 532A has a first wall portion 5322A and a second wall portion 5324A.

As shown in FIG. 32, the first wall portion 5322A of the present embodiment extends outward in the horizontal plane from the outlet portion 519A. More in detail, the first wall portion 5322A extends forward in the front-rear direction from the outlet portion 519A. The first wall portion 5322A has a flat-plate shape extending in the up-down direction. The first wall portion 5322A is perpendicular to the right-left direction. Referring to FIGS. 31 and 32, the first wall portions 5322A of the two reinforcing portions 532A are positioned in the lower communication portion 340 of the lower shield case 300 in the circumferential direction.

As shown in FIG. 32, the second wall portion 5324A of one of the reinforcing portions 532A extends from the first wall portion 5322A so as to be away from a remaining one of the reinforcing portions 532A. Additionally, the second wall portion 5324A of the remaining one of the reinforcing portions 532A extends from the first wall portion 5322A so as to be away from the one of the reinforcing portions 532A. Specifically, the second wall portion 5324A of the reinforcing portion 532A, which is positioned at a right side of the coupling portion 530A, extends from the first wall portion 5322A so as to be away from the reinforcing portion 532A, which is positioned at a left side of the coupling portion 530A, and the second wall portion 5324A of the reinforcing portion 532A at its left side extends from the first wall portion 5322A so as to be away from the reinforcing portion 532A at its right side. More specifically, the second wall portion 5324A of the reinforcing portion 532A at its right side extends rightward from the first wall portion 5322A, and the second wall portion 5324A of the reinforcing portion 532A at its left side extends leftward from the first wall portion 5322A. The second wall portion 5324A has a flat-plate shape extending in the up-down direction. The second wall portion 5324A is perpendicular to the front-rear direction. In other words, the second wall portion 5324A is perpendicular to a direction in which the first wall portion 5322A extends. This prevents folding and deformation of the coupling portion 530A. Referring to FIGS. 31 and 32, the second wall portion 5324A is positioned outward of the lower communication portion 340 of the lower shield case 300 in the circumferential direction. The second wall portion 5324A is positioned outward of the lower shield case 300 in the radial direction. More in detail, the second wall portion 5324A is positioned outward of the lower communication portion 340 of the lower shield case 300 in the radial direction. The second wall portion 5324A is positioned outward of the lower communication portion 340 of the lower shield case 300 in the right-left direction. An inner surface in a circumferential direction of a connection portion of the first wall portion 5322A and the second wall portion 5324A has a rounded corner.

Figure 27:
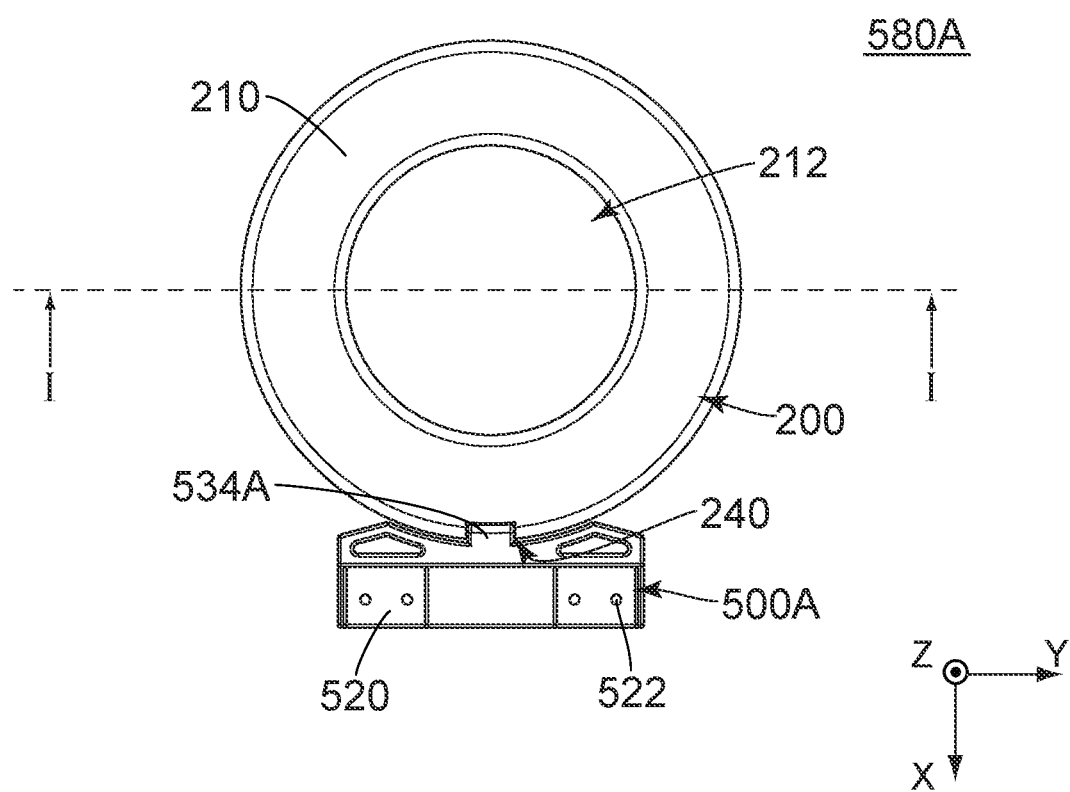
FIG. 27 is a top view showing a shield case composite which is included in the core component of FIG. 25.

As understood from FIGS. 32 and 33, the positioning portion 534A of the present embodiment is positioned above any of the reinforcing portions 532A in the up-down direction. As shown in FIG. 27, the positioning portion 534A is positioned in the upper communication portion 240 of the upper shield case 200 in the circumferential direction. Referring to FIG. 33, an upper part of the positioning portion 534A extends inward in the radial direction beyond an outer surface of the main portion 510A in the radial direction. This prevents folding of the positioning portion 534A.

Figure 26:
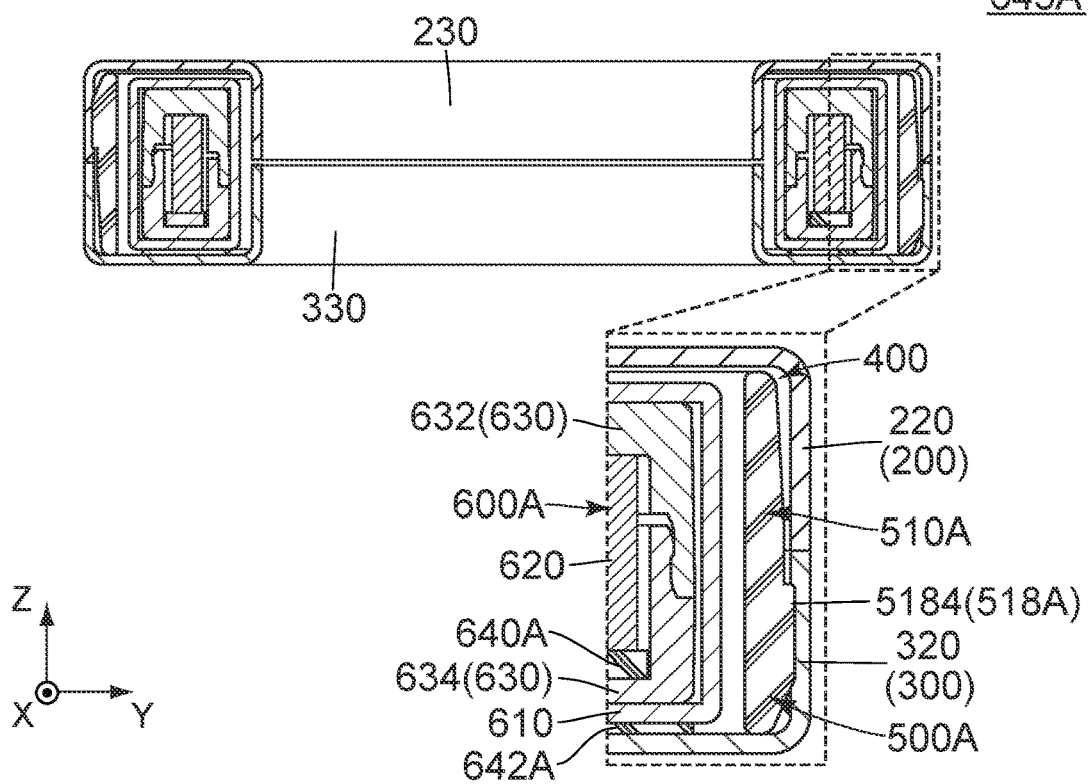
FIG. 26 is a cross-sectional view showing the core component of FIG. 25, taken along line H-H. In the figure, a part of the core component is enlarged and illustrated.

As shown in FIG. 26, the inner member 600A of the present embodiment is positioned between the main portion 510A and any of the inner peripheral portions 230 and 330 in the accommodating portion 400. The inner member 600A is positioned between the main portion 510A and the upper inner peripheral portion 230 in the accommodating portion 400. The inner member 600A is positioned between the main portion 510A and the lower inner peripheral portion 330 in the accommodating portion 400. Referring to FIG. 26, the inner member 600A has an annular ring shape when viewed along the up-down direction. However, the present invention is not limited thereto, but the shape of the inner member 600A is not limited to any particular shape. As shown in FIG. 26, the electric current sensor of the present embodiment is configured so that the inner member 600A is in non-contact with the press-fit member 500A. However, the present invention is not limited thereto, but the inner member 600A may be in contact with the press-fit member 500A. The inner member 600A comprises a coil 610, an electromagnetic core 620, a core case 630 and a cushioning material 640A. The coil 610, the electromagnetic core 620 and the core case 630 of the present embodiment have structures similar to those of the coil 610, the electromagnetic core 620 and the core case 630 of the first embodiment. Accordingly, a detailed explanation thereabout is omitted.

Referring to FIG. 26, the cushioning material 640A of the present embodiment is made of silicone resin. The cushioning material 640A is positioned between a lower core case 634 and the electromagnetic core 620 in the up-down direction. Specifically, the electromagnetic core 620 is indirect contact with the lower core case 634 via the cushioning material 640A. It is noted that the electromagnetic core 620 is in contact with an upper core case 632. This prevents looseness of the electromagnetic core 620 in the core case 630.

As shown in FIG. 26, the electric current sensor of the present embodiment further comprises an adhesive member 642A.

Referring to FIG. 26, the adhesive member 642A of the present embodiment is positioned below the inner member 600A in the accommodating portion 400. The adhesive member 642A is positioned between the lower shield case 300 and the inner member 600A in the up-down direction. The adhesive member 642A glues the inner member 600A and the lower shield case 300 to each other. This prevents looseness of the inner member 600A in the accommodating portion 400. The electric current sensor has a void between the upper shield case 200 and the inner member 600A.

Referring to FIG. 26, the upper shield case 200, the lower shield case 300, the press-fit member 500A, the inner member 600A and the adhesive member 642A form a core component 645A.

Although the specific explanation about the present invention is made above referring to the embodiments, the present invention is not limited thereto and is susceptible to various modifications and alternative forms.

Although the electric current sensor 100 of the first embodiment is configured so that the main portion 510 of the press-fit member 500 is provided with the upper slits 512 and the lower slits 514 each extending in the up-down direction, the present invention is not limited thereto. Specifically, instead of being provided with the upper slits 512 and the lower slits 514, the main portion 510 may be provided with a diamond-shaped hole which pierces the main portion 510 in the radial direction, or may be provided with a slit which extends in the up-down direction and which splits the main portion 510 in the circumferential direction.

Although the main portion 510 of the first embodiment is provided with the outlet portion 519, the present invention is not limited thereto, but the main portion 510 may be provided with no outlet portion 519.

Although the inner member 600 of the first embodiment comprises the core case 630 which accommodates the electromagnetic core 620 and around which the coil 610 is wound, the present invention is not limited thereto, but the inner member 600 comprises no core case 630. In other words, the coil 610 may be directly wound around the electromagnetic core 620.

Although the inner member 600 of the first embodiment has the core sponge 640, the present invention is not limited thereto. Specifically, the inner member 600 may have, instead of the core sponge 640, a cushioning material such as a grease composition.

Although the core component 645 of the first embodiment has the sponge 642, the present invention is no limited thereto, but the core component 645 may have no sponge 642. In this case, the electric current sensor 100 is modified to have a configuration so that the inner member 600 is glued and fixed to the lower shield case 300 while a void is substituted for the sponge 642. If, in particular, the upper shield case 200 is expected to be pushed upward by rebound force of the sponge 642, the electric current sensor 100 is preferred to have the configuration so that the inner member 600 is glued and fixed to the lower shield case 300 while there is the void between the inner member 600 and the upper shield case 200.

Although the main portion 510A of the second embodiment is provided with the outlet portion 519A, the present invention is not limited thereto, but the main portion 510A may be provided with no outlet portion 519A.

Although the inner member 600A of the second embodiment comprises the core case 630 which accommodates the electromagnetic core 620 and around which the coil 610 is wound, the present invention is not limited thereto, but the inner member 600A comprises no core case 630. In other words, the coil 610 may be directly wound around the electromagnetic core 620.

Although the inner member 600A of the second embodiment is configured so that the cushioning material 640A is positioned between the lower core case 634 and the electromagnetic core 620 in the up-down direction, the present invention is not limited thereto. Specifically, the cushioning material 640A may be positioned between the upper core case 632 and the electromagnetic core 620 in the up-down direction. Alternately, two of the cushioning materials 640A may be respectively arranged between the upper core case 632 and the electromagnetic core 620, and between the lower core case 634 and the electromagnetic core 620.

Although the core components 645A of the second embodiment is configured so that the adhesive member 642A is positioned below the inner member 600A in the accommodating portion 400, the present invention is not limited thereto. Specifically, the adhesive member 642A may be positioned above the inner member 600A in the accommodating portion 400. In other words, the adhesive member 642A may be positioned between the upper shield case 200 and the inner member 600A in the up-down direction. In this case, the adhesive member 642A may glue the inner member 600A and the upper shield case 200 to each other. Additionally, the core components 645A may have a void between the inner member 600A and the lower shield case 300 in this case.

In the present invention, the term potting means that accommodating spaces in the housing 750 and the case 800 are filled with potting resin such as urethane or the like so that the upper shield case 200, the lower shield case 300 and the inner member 600, 600A are positioned and fixed, and the term potting does not mean, for example, that potting resin glues the upper shield case 200 and the inner member 600, 600A to each other or glues the lower shield case 300 and the inner member 600, 600A to each other, and the term potting does not mean in short that potting resin glues only facing surfaces and their surroundings of members of the core component 645, 645A to one another.

The present application is based on a Japanese patent applications of JP2020-178746 filed before the Japan Patent Office on Oct. 26, 2020, the contents of which are incorporated herein by reference.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

REFERENCE SIGNS LIST 100 electric current sensor
200 upper shield case
210 upper surface
212 opening
220 upper outer peripheral portion
230 upper inner peripheral portion (inner peripheral portion)
240 upper communication portion
300 lower shield case
310 lower surface
312 opening
320 lower outer peripheral portion
330 lower inner peripheral portion (inner peripheral portion)

340 lower communication portion
400 accommodating portion
500, 500A press-fit member
510, 510A main portion
512 upper slit
514 lower slit
515, 515A upper guide portion
5152, 5152A upper end
517, 517A lower guide portion
5172, 5172A lower end
518, 518A press-fit portion
5182 upper protrusion
5184 lower protrusion
519, 519A outlet portion
520 terminal block portion
522 terminal
530, 530A coupling portion
532, 532A reinforcing portion
5322, 5322A first wall portion
5324, 5324A second wall portion
534, 534A positioning portion
580, 580A shield case composite
600, 600A inner member
610 coil
612 end portion
620 electromagnetic core (toroidal core)
630 core case
632 upper core case
634 lower core case
640 core sponge
640A cushioning material
642 sponge
642A adhesive member
645, 645A core component
650 case sponge
700 circuit board
710 terminal connection portion
720 pin connection portion
750 housing
752 pin
800 case
820 busbar
S1 size
S2 size
SL size
SP size
SU size

The invention claimed is:

1. An electric current sensor comprising an upper shield case, a lower shield case, a press-fit member and an inner member, wherein:
the upper shield case has at least an upper surface and an upper outer peripheral portion;
the upper surface has an opening at its inside;
the upper outer peripheral portion extends downward in an up-down direction from an outer edge of the upper surface;
the lower shield case has at least a lower surface and a lower outer peripheral portion;
the lower surface has an opening at its inside;
the lower outer peripheral portion extends upward in the up-down direction from an outer edge of the lower surface;
at least one of the upper shield case and the lower shield case has an inner peripheral portion which extends along the up-down direction from the opening of the at least one of the upper shield case and the lower shield case;
the upper shield case and the lower shield case form an accommodating portion;
the press-fit member has a main portion;
the main portion pushes both of the upper outer peripheral portion and the lower outer peripheral portion outward in a horizontal plane perpendicular to the up-down direction to integrally fix the upper shield case and the lower shield case to each other;
the inner member comprises a coil and an electromagnetic core; and
the inner member is arranged between the main portion and the inner peripheral portion in the accommodating portion.

2. The electric current sensor as recited in claim 1, wherein the inner member comprises a toroidal core which functions as the electromagnetic core.

3. The electric current sensor as recited in claim 2, wherein:
the main portion has a cylindrical shape extending in the up-down direction; and
the main portion has elasticity and is deformable inward in a radial direction perpendicular to the up-down direction.

4. The electric current sensor as recited in claim 3, wherein the main portion is formed with upper slits and lower slits.

5. The electric current sensor as recited in claim 4, wherein:
the main portion has an upper end and a lower end in the up-down direction;
each of the upper slits extends downward in the up-down direction from the upper end of the main portion; and
each of the lower slits extends upward in the up-down direction from the lower end of the main portion.

6. The electric current sensor as recited in claim 4, wherein the upper slits and the lower slits are alternately arranged in a circumferential direction of the main portion.

7. The electric current sensor as recited in claim 1, wherein:
the main portion has an upper guide portion, a lower guide portion and a press-fit portion;
the press-fit portion is positioned between the upper guide portion and the lower guide portion in the up-down direction;
the upper guide portion has an upper end in the up-down direction;
the upper outer peripheral portion has an inner surface;
in the horizontal plane, the upper end of the upper guide portion has a size smaller than a size of the inner surface of the upper outer peripheral portion of the upper shield case;
the lower guide portion has a lower end in the up-down direction;
the lower outer peripheral portion has an inner surface;
in the horizontal plane, the lower end of the lower guide portion has a size smaller than a size of the inner surface of the lower outer peripheral portion of the lower shield case;
in the horizontal plane, a size of the press-fit portion is greater than the size of the upper end of the upper guide portion;
in the horizontal plane, the size of the press-fit portion is greater than the size of the lower end of the lower guide portion;

the press-fit portion is press-fit into an inside of the upper outer peripheral portion; and the press-fit portion is press-fit into an inside of the lower outer peripheral portion.

8. The electric current sensor as recited in claim 1, wherein:

the press-fit member further has a terminal block portion and a coupling portion;

the terminal block portion is positioned outward beyond any of the upper shield case and the lower shield case in the horizontal plane; and the coupling portion couples the main portion and the terminal block portion with each other.

9. The electric current sensor as recited in claim 8, wherein:

the coupling portion has two reinforcing portions;

the main portion is provided with an outlet portion;

the outlet portion is a hole which pierces the main portion in a radial direction perpendicular to the up-down direction;

the coil has an end portion;

the end portion of the coil is pulled outside the electric current sensor through the outlet portion;

each of the reinforcing portions has a first wall portion and a second wall portion;

the first wall portion extends outward in the horizontal plane from the outlet portion;

the second wall portion of one of the reinforcing portions extends from the first wall portion so as to be away from a remaining one of the reinforcing portions; and the second wall portion of the remaining one of the reinforcing portions extends from the first wall portion so as to be away from the one of the reinforcing portions.

10. The electric current sensor as recited in claim 1, wherein:

the electric current sensor further comprises a sponge; and the sponge is arranged at least one of above and below the inner member in the accommodating portion.

* * * * *